(12) United States Patent
Mizuno et al.

(10) Patent No.: US 7,157,506 B2
(45) Date of Patent: Jan. 2, 2007

(54) RESIN COMPOSITION WITH EXCELLENT DIELECTRIC CHARACTERISTICS, PROCESS FOR PRODUCING RESIN COMPOSITION, VARNISH PREPARED FROM THE SAME, PROCESS FOR PRODUCING THE SAME, PREPEG MADE WITH THESE, AND METAL-CLAD LAMINATE

(75) Inventors: Yasuyuki Mizuno, Ibaraki (JP);
Daisuke Fujimoto, Ibaraki (JP);
Kenichi Tomioka, Ibaraki (JP);
Nozomu Takano, Ibaraki-ken (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/221,171

(22) PCT Filed: Mar. 21, 2001

(86) PCT No.: PCT/JP01/02237

§ 371 (c)(1),
(2), (4) Date: Nov. 15, 2002

(87) PCT Pub. No.: WO01/70885

PCT Pub. Date: Sep. 27, 2001

(65) Prior Publication Data

US 2003/0130412 A1    Jul. 10, 2003

(30) Foreign Application Priority Data

Mar. 21, 2000  (JP)  ............................. 2000-078792
Mar. 21, 2000  (JP)  ............................. 2000-078796

(51) Int. Cl.
*C08K 9/06* (2006.01)

(52) U.S. Cl. ..................... 523/209; 524/611; 524/588

(58) Field of Classification Search ............... 428/447; 523/209; 524/611, 588
See application file for complete search history.

(56) References Cited

U.S. PATENT DOCUMENTS 6,156,831 A     12/2000  Sase et al. .................. 524/101
6,572,968 B1 *   6/2003  Takano et al. .............. 428/391

FOREIGN PATENT DOCUMENTS

| EP | 0889096 | 1/1999 |
|---|---|---|
| JP | 46-41112 | 12/1971 |
| JP | 52-31279 | 8/1977 |
| JP | 61-18937 | 5/1986 |
| JP | 61272243 | 12/1986 |
| JP | 62275744 | 11/1987 |
| JP | 63-33505 | 7/1988 |
| JP | 63-33506 | 7/1988 |
| JP | 5-77705 | 7/1991 |
| JP | 4-91160 | 3/1992 |
| JP | 5-311071 | 11/1993 |
| JP | 6-92533 | 11/1994 |
| JP | 8-176273 | 7/1996 |
| JP | 10212336 | 8/1998 |
| JP | 10273533 | 10/1998 |
| JP | 11-21503 | 1/1999 |
| JP | 11-21504 | 1/1999 |
| JP | 11-21506 | 1/1999 |
| JP | 11-60951 | 3/1999 |
| WO | 97/01595 | * 1/1997 |

OTHER PUBLICATIONS

English Language Abstract of JP 10-212336.
English Language Abstract of JP 61-272243.
English Language Abstract of JP 11-60951.
English Language Abstract of JP 11-21503.
English Language Abstract of JP 11-21504.
English Language Abstract of JP 11-21506.
English language Abstract of JP 10-273533.
English Language Abstract of JP 8-176273.
English Language Abstract of JP 46-41112.
English Language Abstract of JP 52-31279.
English Language Abstract of JP 5-77705.
English Language Abstract of JP 6-92533.
English Language Abstract of JP 63-33506.
English Language Abstract of JP 5-311071.
English Language Abstract of JP 61-18937.
English Language Abstract of JP 63-33505.
English Language Abstract of JP 62-275744.
English Language Abstract of JP 4-91160.

* cited by examiner

*Primary Examiner*—Margaret G. Moore
(74) *Attorney, Agent, or Firm*—Antonelli, Terry, Stout and Kraus, LLP.

(57) ABSTRACT

A resin composition comprising a cyanate compound (A) having 2 or more cyanato groups in the molecule; a phenol compound (B); a silicone polymer (D) having at least one siloxane unit selected from the group consisting of a tri-functional siloxane unit represented by the formula $RSiO_{3/2}$ and tetra-functional siloxane unit represented by $SiO_{4/2}$, polymerization degree of 7,000 or less, and at least one terminal functional group reactive with hydroxyl group; and inorganic filler (E).

16 Claims, No Drawings

RESIN COMPOSITION WITH EXCELLENT DIELECTRIC CHARACTERISTICS, PROCESS FOR PRODUCING RESIN COMPOSITION, VARNISH PREPARED FROM THE SAME, PROCESS FOR PRODUCING THE SAME, PREPEG MADE WITH THESE, AND METAL-CLAD LAMINATE

TECHNICAL FIELD

The present invention relates to a resin composition, suitable for printed-wiring boards for various purposes, e.g., parts for filters to be built in terminal devices for wireless communications which are required to show a low loss of signal in a high-frequency bandwidth, antennas at wireless base stations and high-speed computers including microprocessors which work at an operating frequency exceeding several hundreds MHz; varnish, prepreg and metallic copper clad laminate produced using the resin composition; and process for producing the resin composition.

BACKGROUND ART

Recently, electronic devices for movable communications are required to process a large volume of information at a high speed, and electrical signals which they handle are increasing in frequency. However, intensity of a signal tends to decay faster as its frequency increases. Therefore, the printed-wiring boards in this field need board materials of low transmission loss. In other words, it is necessary to use resin materials of low relative dielectric constant and dielectric loss tangent in a high frequency bandwidth for these boards.

For electronic devices, e.g., computers, high-speed microprocessors working at an operating frequency exceeding 500 MHz have been developed and signal frequency has been increasing, in order to allow them to treat a larger volume of information in a shorter time. One of the problems which have come to the fore in those devices handling high-speed pulse signals is delay on the printed-wiring board. Signal delay time on a printed-wiring board increases in proportion to the square root of relative dielectric constant of the insulator around the wiring. Therefore, the wiring boards for computers or the like need resins of lower relative dielectric constant as the board materials.

The related industries have been using thermoplastic resin materials of low relative dielectric constant and dielectric loss tangent, e.g., fluorine-based ones, to cope with the increased signal frequency. These materials, however, tend to lack fluidity resulting from their high melt viscosity, which causes problems, e.g., need for high temperature and pressure for pressing, and insufficient dimensional stability and adhesion to plated metals. Several proposals have been made to solve these problems, e.g., use of a composition comprising epoxy-based resin and cyanate ester which is known as one of the resins of lowest relative dielectric constant and dielectric loss tangent among thermosetting resins (Japanese Patent Publication No. 46-41112) as a composition of cyanate ester, and a composition comprising bismaleimide, cyanate ester and epoxy-based resin (Japanese Patent Publication No. 52-31279).

Use of thermoplastic resins is also proposed to improve the high-frequency characteristics. These resins include resin compositions based on a polyphenylene ether (PPO or PPE), which shows good dielectric properties among heat-resistant, thermoplastic resins, e.g., a resin composition comprising a polyphenylene ether, crosslinkable polymer and monomer (Japanese Patent Publication No. 5-77705), and another one comprising a polyphenylene ether having a specific settable functional group and crosslinkable monomer (Japanese Patent Publication No. 6-92533).

The other resin compositions proposed to improve the high-frequency characteristics include those comprising a cyanate ester resin and polyphenylene ether having good dielectric properties, e.g., a composition comprising a cyanate ester, bismaleimide and polyphenylene ether (Japanese Patent Laid-open Publication No. 63-33506), and another one comprising a product by the reaction between a phenol-modified resin and cyanate ester, and polyphenylene ether (Japanese Patent Laid-open Publication No. 5-311071). Another resin composition as a heat-resistant forming material of good dielectric properties is comprising a polyphenylene ether and cyanate ester resin kneaded with each other (Japanese Patent Publication No. 61-18937).

On the other hand, printed-wiring boards, not limited to those for signals of higher frequency, have been becoming more and more densified by increasing number of layers for the laminate, making the laminate thinner, and decreasing through-hole size and pitch as electronic devices becoming more compact and more functional. Therefore, the laminate is increasingly required to have higher heat resistance, drill-machinability and insulation characteristics, among others. The methods which have been widely used to improve heat resistance and insulation characteristics of the resins include increasing their glass transition temperature (Tg) to improve the properties of their set products. However, improvement of the resin alone is insufficient to fully satisfy the above characteristics.

One of the methods to solve these problems is use of an inorganic filler as one component for the resin composition. Inorganic fillers have been studied not only as a bulking agent but also as an agent for improving properties of the composition, e.g., dimensional stability and resistance to moisture and heat. More recently, use of a special filler has been studied to provide the composition with excellent functions, e.g., high dielectric constant, low dielectric loss tangent, high heat radiation and high strength.

Under these circumstances, incorporation of an inorganic filler is proposed also for resin materials which can handle high-frequency signals to improve their properties, e.g., heat resistance and dimensional stability. Some of the filler-incorporated resin compositions proposed so far include those comprising a cyanate ester and bismaleimide, and cyanate ester, bismaleimide and epoxy-based resin (Japanese Patent Publication No. 63-33505); polyphenylene ether and crosslinkable monomer (Japanese Patent Laid-open Publication Nos. 62-275744 and 4-91160); and phenol-modified polyphenylene ether and epoxy resin (Japanese Patent Publication No. 10-212336).

However, the method disclosed by Japanese Patent Publication No. 46-41112 or 52-31279, although giving a resin composition of slightly decreased relative dielectric constant, involves a problem of insufficient high-frequency characteristics of the composition, resulting from incorporation of a thermosetting resin other than a cyanate ester resin.

The method disclosed by Japanese Patent Publication No. 5-77705 or 6-92533, although giving a resin composition of improved dielectric properties, involves a problem of high melt viscosity and hence insufficient fluidity of the composition, resulting from polyphenylene ether as the major component, which is inherently thermoplastic polymer. The resin composition, therefore, is unsuitable for laminates because it needs high temperature and pressure in the pressing step, and also unsuitable for multi-layered printed-wiring boards which are treated to fill the groove between fine circuit patterns because of its insufficient formability.

The method disclosed by Japanese Patent Publication No. 63-33506 or 5-311071, although giving a resin composition of slightly improved dielectric properties, involves a problem of still insufficient high-frequency characteristics of the composition, resulting from the thermosetting resin used in combination with the polyphenylene ether, because it is a product of the reaction between the bismaleimide and cyanate ester resin, or between the phenol-modified resin and cyanate ester, and brings the adverse effect(s) of the component other than the cyanate ester. Increasing the polyphenylene ether content to improve high-frequency characteristics of the composition may cause a problem of deteriorated formability resulting from high melt viscosity and hence insufficient fluidity of the composition, as is the case with the above-described polyphenylene ether-based one.

The resin composition comprising a polyphenylene ether and cyanate ester resin kneaded with each other (Japanese Patent Publication No. 61-18937), although having good dielectric properties and relatively good formability, because of decreased melt viscosity resulting from modification with the cyanate ester resin, tends to have the dielectric properties of high relative dielectric constant for its low dielectric loss tangent, when the cyanate ester is separately incorporated as a setting component, with the result that transmission loss may not be sufficiently reduced in a GHz bandwidth. Moreover, decreasing the cyanate ester content to decrease dielectric loss tangent of the composition, which is accompanied by increased polyphenylene ether, may cause a problem of deteriorated formability resulting from high melt viscosity and hence insufficient fluidity of the composition, as is the case with the above-described polyphenylene ether-based one.

In the method which incorporates an inorganic filler in a resin composition to make the laminate of the composition more functional (Japanese Patent Publication No. 63-33505), the filler selected from the common ones begins to settle gradually when incorporated in a varnish. It is therefore necessary to disperse the filler by an adequate procedure, e.g., stirring the composition again, before it is spread. However, it may not be sufficiently dispersed by stirring alone, when it settles massively to agglomerate. The filler may cause other problems in the prepreg production step; it will settle in a portion in a varnish tank or impregnation tank where varnish tends to accumulate, and also will be gradually deposited on a roll or the like, to decrease spreadability (workability) of the composition, significantly deteriorating outer appearances of the prepreg and preventing uniform dispersion of the filler, and hence deteriorating properties of the laminate of the composition, e.g., adhesion at the interface, resistance to moisture, drill-machinability and insulation characteristics.

One of the methods to improve dispersibility of the filler is coating the filler particles beforehand with a coupling agent or the like. However, the surface treatment increases the filler cost and greatly limits types of the commercial available products, and it is difficult to select the treated filler suitable for a variety of resin composition production systems. On the other hand, quantity of a filler incorporated in resin materials tends to increase, for improving their functions more, which is accompanied by significantly increased quantity of the filler settling in a system and deposited on a roll or the like. Therefore, the filler has been increasingly required to be more dispersible and thixotropic. The conventional treatment with a coupling agent is difficult to satisfy these characteristics.

When a filler is to be surface-treated, it is normally dried under heating after being treated, e.g., by being immersed in, or sprayed with, a diluted solution of the treatment agent. The drying step involves two types of problems, oligomerization of the coupling agent on the treated filler surface to form a physically adsorbed layer, and agglomeration of the filler particles, which requires finely crushing the agglomerates before the filler is incorporated in a varnish, which, in turn, causes a problem of leaving an unevenly treated layer on the filler surface. The physically adsorbed layer and unevenly treated layer, when formed, deteriorate adhesion of the resultant laminate at the interface between the filler and resin.

One method directly adds a coupling agent while a varnish is being incorporated (Japanese Patent Laid-open Publication No. 61-272243). The varnish used in this method is viscous, because the resin is incorporated beforehand. Therefore, it can avoid agglomeration of the filler particles to some extent, but is difficult to selectively direct the coupling agent evenly onto the filler particle surfaces, causing problems of insufficient adhesion at the interface between the inorganic filler and resin, and insufficient dispersibility of the filler in the resin.

Particularly, incorporation of an inorganic filler in the polyphenylene ether-based resin material, disclosed in Japanese Patent Laid-open Publication No. 62-275744, 4-91160 or 10-212336, involves a problem of very high viscosity of the molten polyphenylene ether and of the solution of the ether dissolved in a solvent, making it difficult to evenly disperse the filler in the resin. This significantly agglomerates the filler particles, producing the defects, e.g., voids, at the interface between the inorganic filler and resin, and deteriorates properties of the set product and laminate of the composition, e.g., resistance to moisture, drill-machinability and insulation characteristics.

Surface treatment of an inorganic filler on a commercial scale is completed in a very short time, even when the filler is treated with a common, commercial coupling agent. As a result, the filler particles are surface-treated insufficiently, because they are covered only with a rigid, thin layer unevenly. Moreover, the physically adsorbed layer tends to be eluted out into the resin layer, and elution of the adsorbed layer, when occurs, is likely to cause problems, e.g., unevenly set resin in the vicinity of the interface, and adhesion to the interface between the filler and resin, resulting from reduced strength. As discussed above, it is difficult to disperse an inorganic filler in a highly viscous polymer, e.g., polyphenylene ether, without agglomerating the filler particles. Therefore, incorporation of an inorganic filler in the resin has caused problems of deteriorated properties of the laminate of the resultant composition, e.g., resistance to moisture, drill-machinability and insulation characteristics, as discussed above. Moreover, a resin material based on a thermoplastic resin, e.g., polyphenylene ether, involves a problem of insufficient dimensional stability and adhesion to plated metals.

The present invention has been developed under these situations. It is an object of the present invention to provide a resin composition exhibiting excellent dielectric properties in a high-frequency bandwidth, as formable and machinable as a laminate of the conventional thermosetting resin, e.g., epoxy resin, and capable of giving laminates and printed-wiring boards of high heat resistance and excellent reliability of electrical insulation. It is another object of the present invention to provide a process for producing a varnish, prepreg and metal-clad laminate using the above resin composition, and the resin composition itself.

DISCLOSURE OF THE INVENTION

The inventors of the present invention have found, after extensive study to solve the above problems, that the object of the present invention can be achieved by use of a resin composition comprising: a cyanate ester compound; phenol compound; and inorganic filler treated with a silicone polymer which has a functional group reactive with surface hydroxylic group by its structure or after absorbing moisture.

They have also found that the object of the present invention can be achieved by use of the above resin composition incorporated with a polyphenylene ether resin.

They have also found that the object of the present invention can be achieved by use of the above resin composition incorporated with a phenol-modified cyanate ester oligomer composition, as the product of the reaction between a cyanate ester compound and phenol compound, in place of the above-described cyanate ester compound.

The present invention is a resin composition comprising, as its essential components: a cyanate compound (A) having 2 or more cyanato groups in the molecule; a phenol compound (B); a silicone polymer (D) having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least one terminal functional group reactive with hydroxyl group; and an inorganic filler (E).

The present invention is a resin composition comprising: a cyanate compound (A) having 2 or more cyanato groups in the molecule; phenol resin (B); and inorganic filler (F) surface-treated with a silicone polymer having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least one terminal functional group reactive with hydroxyl group.

The present invention is a resin composition comprising: a phenol-modified cyanate ester oligomer produced by reacting a cyanate compound (A) having 2 or more cyanato groups in the molecule with a phenol compound (B) at an equivalent ratio of the phenolic hydroxylic group in the phenol compound (B) to the cyanato group in the cyanate compound (A) (hydroxylic group/cyanato group ratio) in a range from 0.01 to 0.30; the phenol compound (B) incorporated at an equivalent ratio of the phenolic hydroxylic group in the phenol compound (B) to the cyanato group in the cyanate compound (A) (hydroxylic group/cyanato group ratio) in a range below 0.29 (this equivalent ratio is in a range from 0.025 to 0.30, with this phenol compound (B) combined with the phenol compound (B) used for production of the phenol-modified cyanate ester oligomer); and an inorganic filler (F) surface-treated with a silicone polymer (D) having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least one terminal functional group reactive with the hydroxyl group.

The present invention is the above resin composition which further contains a polyphenylene ether resin (C).

The present invention is a resin composition comprising: a phenol-modified cyanate ester oligomer containing a polyphenylene ether resin, produced by reacting a cyanate compound (A) with a phenol compound (B) in the presence of a polyphenylene ether resin (C) at an equivalent ratio of the phenolic hydroxylic group in the phenol compound (B) to the cyanato group in the cyanate compound (A) (hydroxylic group/cyanato group ratio) in a range from 0.01 to 0.30; the phenol compound (B) incorporated at an equivalent ratio of the phenolic hydroxylic group in the phenol compound (B) to the cyanato group in the cyanate compound (A) (hydroxylic group/cyanato group ratio) in a range below 0.29 (this equivalent ratio is in a range from 0.025 to 0.30, with this phenol compound (B) combined with the phenol compound (B) used for production of the phenol-modified cyanate ester oligomer); and an inorganic filler (F) surface-treated with a silicone polymer (D) having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least one terminal functional group reactive with the hydroxyl group.

The present invention is a process for producing a phenol-modified cyanate ester oligomer by reacting a cyanate compound (A) having 2 or more cyanato groups in the molecule with a phenol compound (B) represented by the general formula (I) at an equivalent ratio of the phenolic hydroxylic group in the phenol compound (B) represented by the general formula (I) to the cyanato group in the cyanate compound (A) having 2 or more cyanato groups in the molecule (hydroxylic group/cyanato group ratio) in a range from 0.025 to 0.30.

The present invention is a resin varnish produced by dissolving or dispersing one of the above resin composition in a solvent.

The present invention is a metal-clad laminate produced by drying a base material impregnated with one of the above resin compositions or resin varnish to produce the prepreg, placing the two or more prepreg sheets one on another to produce the laminate, and heating and pressing the laminate after it is coated with a metallic foil on at least one of the external sides.

The resin composition, varnish and prepreg provided by the present invention are excellent in dispersibility of the inorganic filler in the resin material and also in adhesion at the interface between the inorganic filler and resin material, high in dimensional stability, good in workability when they are spread on an object, and also good in outer appearances of the prepreg. Therefore, the metal-clad laminate produced using them is excellent in heat resistance and moisture when it absorbs moisture, and good in drill-machinability and resistance to electric corrosion. Moreover, it has excellent dielectric properties in a high-frequency region, and hence is suitable for materials and parts for printed-wiring boards for a variety of electric and electronic devices which handle high-frequency signals.

The present invention discloses the subject matters in Japanese Patent Application Nos. 2000-78792 and 2000-78796 filed on Mar. 21, 2000, which are included in this specification after referring to these applications.

BEST MODE FOR CARRYING OUT THE INVENTION

The cyanate compound (A) for the resin composition of the present invention is not limited. The cyanate compounds useful for the present invention include one or more compounds selected from those represented by the general formula (I):

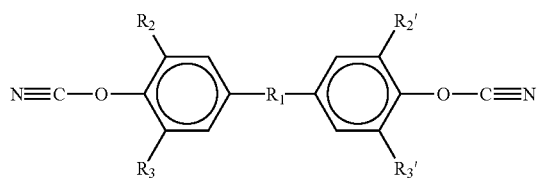

(wherein, $R_1$ is an alkylene group of 1 to 3 carbon atoms, which may be substituted by a halogen atom, or represented by the general formula (II) or (III); $R_2$, $R_2'$, $R_3$, and $R_3'$ are each hydrogen atom or an alkyl group of 1 to 4 carbon atoms, preferably 1 to 3 carbon atoms, and may be the same or different, even all of them may be the same; and $R_4$ and $R_4'$ are each an alkylene group of 1 to 3 carbon atoms, and may be the same or different):

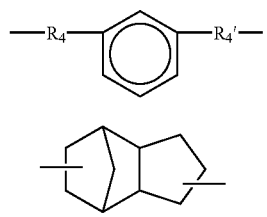

The preferable examples of $R_1$ include:

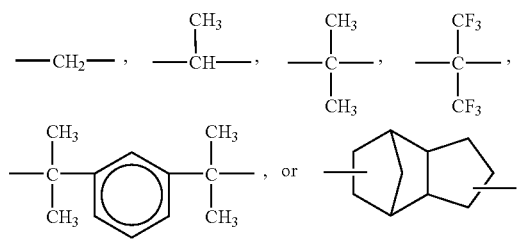

More specifically, the cyanate compounds represented by the general formula (I) include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, and cyanate-esterified phenol-added dicyclopentadiene polymer. These compounds may be used either individually or in combination.

The phenol compound (B) for the resin composition of the present invention is not limited. However, at least one monovalent phenol compound selected from those represented by the general formula (IV) or (V) is preferable:

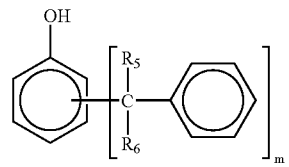

(wherein, $R_5$ and $R_6$ are each hydrogen atom or methyl group, and may be the same or different; "m" is an integer of 1 to 3; and the phenyl group may be substituted by methyl, ethyl or propyl group, or halogen atom, e.g., bromine, although not shown)

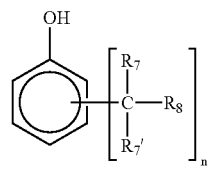

(wherein, $R_7$ and $R_7'$ are each hydrogen atom or methyl group, and may be the same or different; $R_8$ is an alkyl group of 1 to 5 carbon atoms, e.g., methyl, ethyl or 2,2-dimethylpropyl; and "n" is an integer of 1 to 3, preferably 1 to 2)

The phenol compounds represented by the formula (IV) include p-(α-cumyl)phenol, and mono-, di- or tri-(α-methylbenzyl)phenol. The phenol compounds represented by the formula (V) include p-tert-butylphenol, 2,4- or 2,6-di-tert-butylphenol, p-tert-aminophenol and p-tert-octylphenol. These phenol compounds may be used either individually or in combination.

The phenol compound (B) is incorporated in the resin composition of the present invention preferably at 0.025 to 0.30 equivalents of the phenolic hydroxylic group in the phenol compound (B) per equivalent of the cyanato group in the cyanate compound (A) (hydroxylic group/cyanato group ratio), more preferably 0.025 to 0.25, still more preferably 0.025 to 0.20. At a hydroxylic group/cyanato group ratio below 0.025, dielectric properties of the resin composition may not be sufficient, and there is a tendency that its dielectric loss tangent cannot be sufficiently reduced. At a ratio above 0.30, one the other hand, its dielectric loss tangent may be conversely increased excessively and there is a tendency that its heat resistance deteriorates while it is absorbing moisture.

The cyanate compound (A) and phenol compound (B) for the resin composition of the present invention may be replaced by a phenol-modified cyanate ester oligomer produced by reacting the cyanate compound (A) with the phenol compound (B) at an equivalent ratio of the phenolic hydroxylic group in the phenol compound (B) to the cyanato group in the cyanate compound (A) (hydroxylic group/cyanato group ratio) in a range from 0.01 to 0.30, or also may be replaced by a phenol compound (B) incorporated at an equivalent ratio of the phenolic hydroxylic group in the phenol compound (B) to the cyanato group in the cyanate compound (A) (hydroxylic group/cyanato group ratio) in a range below 0.29.

Moreover, the intended object of the present invention can be also achieved by use of a composition of the above-described phenol-modified cyanate ester oligomer.

In the production of the phenol-modified cyanate ester oligomer by the reaction between the cyanate compound (A) and phenol compound (B), the required quantity of the phenol compound (B) may be charged all at once from the initial stage of reaction, or in installments. Quantity of the compound (B) other than the initial charge is 0 to 0.29 equivalents of its phenolic hydroxylic group per equivalent of the cyanato group in the cyanate compound (A). Charging the additional compound (B) in excess of the above level may deteriorate properties of the resultant resin compound, e.g., dielectric properties and heat resistance while it is absorbing moisture. It is particularly preferable to first charge the compound (B) at 0.01 to 0.03 equivalents of its phenolic hydroxylic group per equivalent of the cyanato group in the cyanate compound (A) for the reaction with the compound (A), and then charge the additional compound (B) at 0.15 to 0.29 equivalents of its phenolic hydroxylic group per equivalent of the cyanato group in the cyanate compound (A) as the starting compound after the reaction in the first stage is completed. The phenol compound as the initial charge for production of the phenol-modified cyanate ester oligomer may be the same as, or different from, the additional charge of the compound (B).

It is preferable, when the phenol compound is charged in installments, to charge the phenol compound (B) at 0.025 to 0.3 equivalents of its phenolic hydroxylic group in total of the initial and additional charges per equivalent of the cyanato group in the cyanate compound (A).

The phenol compound as the initial charge for production of the phenol-modified cyanate ester oligomer may be the same as, or different from, the additional charge of the compound (B). Two or more types of phenol compounds may be used for production of the phenol-modified cyanate ester oligomer.

The phenol-modified cyanate ester oligomer produced by the reaction between the cyanate compound (A) and phenol compound (B) is a mixture comprising the cyanate ester oligomers (mainly trimer, pentamer, heptamer, nonamer and undecamer) produced by cyclization of the cyanate compound (A) itself to form triazine rings; modified (imido-carbonated) oligomers with the phenolic hydroxylic group in the phenol compound (B) added to the cyanato group in the cyanate compound (A); and modified oligomers with 1 or 2 molecules of the phenol compound (B) included in the structure which constitutes the triazine ring, i.e., the compound with 1 or 2 out of 3 chains extending from the triazine ring substituted by the molecules derived from the phenol compound.

When the cyanate compound (A) is represented by the following formula (I-1), the phenol compound (B) is represented by the following formula (I-2), the resultant trimers as the cyanate ester oligomers are represented by one of the following formulae (I-3), (I-4) and (I-5), and imido-carbonated modified oligomers are represented by the formula (I-6).

$$N{\equiv}C{-}O{-}Ar_1{-}O{-}C{\equiv}N \quad (I\text{-}1)$$

$$Ar_2{-}OH \quad (I\text{-}2)$$

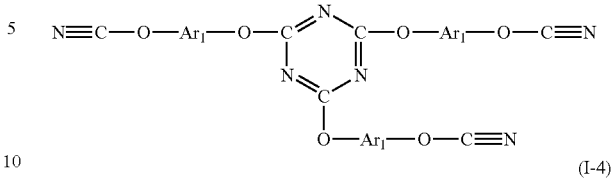
(I-3)

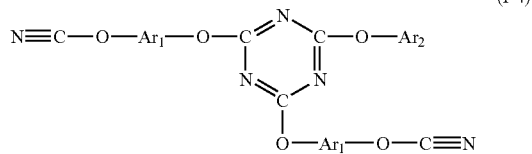
(I-4)

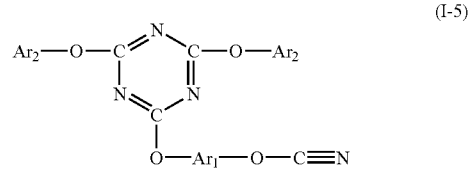
(I-5)

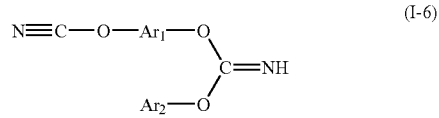
(I-6)

The phenol-modified cyanate ester oligomer has a number-average molecular weight of 380 to 2,500, and particularly preferably 800 to 2,000. The compound having a number-average molecular weight below 380 may cause recrystallization of the cyanate monomer in a solvent, when it is dissolved in that solvent to produce the varnish, because the cyanate compound (A) is highly crystalline. This type of problem will also occur when the cyanate compound (A) is converted. On the other hand, the compound having a number-average molecular weight above 2,500 may cause other problems when used to produce a varnish: the resultant varnish may be excessively viscous, making the base material of glass or the like difficult to be impregnated therewith, and deteriorating surface smoothness of the resultant prepreg; it may gel too quickly, making spreading difficult; and it may lose storage stability (pot life).

The phenol-modified cyanate ester oligomer and polyphenylene ether resin (C) for the resin composition of the present invention may be replaced by the phenol-modified cyanate ester oligomer containing a polyphenylene ether resin, produced by reacting the cyanate compound (A) with the phenol compound (B) in the presence of the polyphenylene ether resin (C). More specifically, the phenol-modified cyanate ester oligomer containing a polyphenylene ether resin, which may be dissolved in a solution, is produced by reacting the cyanate compound (A) with the phenol compound (B) in the polyphenylene ether resin (C) being molten under heating or dissolved in a solvent at an equivalent ratio of the phenolic hydroxylic group in the phenol compound (B) to the cyanato group in the cyanate compound (A) (hydroxylic group/cyanato group ratio) in a range from 0.01 to 0.30. This procedure gives the resin of the so-called "semi-interpenetrating polymer network (semi-IPN), in which the phenol-modified cyanate oligomer and polyphenylene ether resin are uniformly dissolved in each other.

When the phenol-modified cyanate ester oligomer or phenol-modified cyanate ester oligomer containing a polyphenylene ether resin is used for the resin composition of the present invention, the cyanate compound (A) is reacted to produce the oligomer at a conversion of preferably 10 to 70% by mol, estimated by gel permeation chromatography, more preferably 20 to 70%. At a conversion of the cyanate compound (A) below 10%, the unreacted cyanate compound (A), which is highly crystalline, may be recrystallized in a solvent, when the phenol-modified cyanate ester oligomer or phenol-modified cyanate ester oligomer containing a polyphenylene ether resin is dissolved in that solvent to produce the varnish. At a conversion of the cyanate compound (A) above 70%, on the other hand, it may cause other problems when used to produce a varnish: the resultant varnish may be excessively viscous, making the base material of glass or the like difficult to be impregnated therewith, and deteriorating surface smoothness of the resultant prepreg; it may gel too quickly, making spreading difficult; and it may lose storage stability (pot life).

The compounds useful for the polyphenylene ether resin (C) for the resin composition of the present invention include poly(2,6-dimethyl-1,4-phenylene) ether, alloyed polymer of poly(2,6-dimethyl-1,4-phenylene) ether and polystyrene, and alloyed polymer of poly(2,6-dimethyl-1,4-phenylene) ether and styrene/butadiene copolymer. The alloyed polymer of poly(2,6-dimethyl-1,4-phenylene) ether and polystyrene, or alloyed polymer of poly(2,6-dimethyl-1,4-phenylene) ether and styrene/butadiene copolymer, when used for the present invention, preferably contains the poly(2,6-dimethyl-1,4-phenylene) ether component at 50% or more.

The polyphenylene ether resin (C) is incorporated preferably at 5 to 300 parts by weight per 100 parts by weight of the cyanate compound (A), more preferably 10 to 250 parts, still more preferably 15 to 220 parts. It is incorporated preferably at 5 parts by weight to secure the sufficient dielectric properties of the resin composition. When incorporated at the above 300 parts by weight, it may cause insufficient fluidity of the resin composition due to excessively increased viscosity, and hence deteriorate its formability and the reactivity of the cyanate compound (A).

The silicone polymer (D) for the resin composition of the present invention has at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least one terminal functional group reactive with hydroxyl group. The polymerization degree is preferably 3 or more, more preferably 3 to 1,000. It is estimated from molecular weight of the polymer in the case of low polymerization degree, or from number-average molecular weight of the polymer determined by gel permeation chromatography with a calibration curve of the standard polystyrene or polyethylene glycol. The silicone polymer (D) may contain, in addition to the tri- or tetra-functional siloxane unit, a bi-functional siloxane unit represented by $RSiO_{2/2}$ (wherein, $R_2$ is an organic group, and when 2 or more $R_2$s are present in the silicone polymer, they may be the same or different).

R for the tri- and bi-functional siloxane units is an alkyl group of 1 to 4 carbon atoms, phenyl group or the like, and the functional group reactive with hydroxyl group is silanol group, alkoxy group of 1 to 4 carbon atoms, acyloxy group of 1 to 4 carbon atoms, halogen atom, e.g., chlorine or bromine, or the like.

The tetra-functional siloxane unit may contain 1 to 3 residual hydrolysable or OH groups, tri-functional siloxane unit may contain 1 to 2 residual hydrolysable or OH groups, and bi-functional siloxane unit may contain a residual hydrolysable or OH group.

The silicone polymer (D) for the present invention has at least one siloxane unit selected from the group consisting of a three-dimensionally crosslinked tri- and tetra-functional group, or a three-dimensionally crosslinked tri-, tetra- and bi-functional group. These groups are three-dimensionally crosslinked without being completely set or gelled. That they are not completely set or gelled can be confirmed by, e.g., the dissolution of the silicone polymer in a reaction solvent. The silicone polymer (D) is preferably composed of a tri-functional siloxane unit alone, tetra-functional siloxane unit alone, bi- and tri-functional siloxane unit, bi- and tetra-functional siloxane unit, tri- and tetra-functional siloxane unit, or bi-, tri- and tetra-functional siloxane unit. For the content of each siloxane unit, the tetra- or tri-functional siloxane unit accounts for 15 to 100% of the total siloxane units, preferably 20 to 100%; and the bi-functional siloxane unit for 0 to 85%, preferably 0 to 80%, all percentages in mol. It is particularly preferable that the silicone polymer (D) contains the tetra-functional siloxane unit at 15 to 100%, more preferably 20 to 60%, tri-functional siloxane unit at 0 to 85%, more preferably 0 to 80%, and bi-functional siloxane unit at 0 to 85%, more preferably 0 to 80%.

The silicone polymer (D) for the present invention is produced by hydrolysis and subsequent polycondensation of a silane compound, represented by the general formula $R'_n SiX_{4-n}$ (XI) (wherein, R' is a non-reactive group, e.g., an alkyl group of 1 to 4 carbon atoms or aryl group, e.g., phenyl group, which may have a substituent, e.g., an alkyl group of 1 to 4 carbon atoms or halogen atom; X is a group which can be hydrolyzed to form OH group, e.g., a halogen atom (chlorine, bromine or the like) or —OR; R is an alkyl group of 1 to 4 carbon atoms or alkyl carbonyl group of 1 to 4 carbon atoms; and "n" is an integer of 0 to 2).

More specifically, the silane compounds represented by the above general formula include tetra-functional silane compounds, e.g., tetraalkoxysilanes (functionality of the silane compound means that it has a condensable functional group), e.g., $Si(OCH_3)_4$, $Si(OC_2H_5)_4$, $Si(OC_3H_7)_4$ and $Si(OC_4H_9)_4$;

tri-functional silane compounds, e.g., monoalkyl trialkoxysilanes, e.g.,
$H_3CSi(OCH_3)_3$, $H_5C_2Si(OCH_3)_3$, $H_7C_3Si(OCH_3)_3$, $H_9C_4Si(OCH_3)_3$, $H_3CSi(OC_2H_5)_3$, $H_5C_2Si(OC_2H_5)_3$, $H_7C_3Si(OC_2H_5)_3 H_9C_4Si(OC_2Hs)_3$, $H_3CSi(OC_3H_7)_3$, $H_5C_2Si(OC_3H_7)_3$, $H_7C_3Si(OC_3H_7)_3$, $H_9C_4Si(OC_3H_7)_3$, $H_3CSi(OC_4H_9)_3$, $H_5C_2Si(OC_4H_9)_3$, $H_7C_3Si(OC_4H_9)_3$ and $H_9C_4Si(OC_4H_9)_3$, phenyl trialkoxysilane, e.g.,
$PhSi(OCH_3)_3$, $PhSi(OC_2H_5)_3$, $PhSi(OC_3H_7)_3$ and $PhSi(OC_4H_9)_3$, (wherein, Ph is phenyl group), monoalkyl triacyloxysilane, e.g.,
$(H_3CCOO)_3SiCH_3$, $(H_3CCOO)_3SiC_2H_5$, $(H_3CCOO)_3SiC_3H_7$ and $(H_3CCOO)_3SiC_4H_9$, and monoalkyl trihalogenosilanes, e.g.,
$Cl_3SiCH_3$, $Cl_3SiC_2H_5$, $Cl_3SiC_3H_7$, $Cl_3SiC_4H_9$, $Br_3SiCH_3$, $Br_3SiC_2H_5$, $Br_3SiC_3H_7$ and $Br_3SiC_4H_9$; and bi-functional silane compounds, e.g., dialkyl dialkoxysilanes, e.g.,
$(H_3C)_2Si(OCH_3)_2$, $(H_5C_2)_2Si(OCH_3)_2$, $(H_7C_3)_2Si(OCH_3)_2$, $(H_9C_4)_2Si(OCH_3)_2$, $(H_3C)_2Si(OC_2H_5)_2$, $(H_5C_2)_2Si(OC_2H_5)_2$, $(H_7C_3)_2Si(OC_2H_5)_2$, $(H_9C_4)_2Si(OC_2H_5)_2$, $(H_3C)_2Si(OC_3H_7)_2$, $(H_5C_2)_2Si(OC_3H_7)_2$, $(H_7C_3)_2Si(OC_3H_7)_2$, $(H_9C_4)_2Si(OC_3H_7)_2$, $(H_3C)_2Si(OC_4H_9)_2$, $(H_5C_2)_2Si(OC_4H_9)_2$, $(H_7C_3)_2Si(OC_4H_9)_2$ and $(H_9C_4)_2Si(OC_4H_9)_2$, diphenyl dialkoxysilanes, e.g., $Ph_2Si(OCH_3)_2$ and $Ph_2Si(OC_2H_5)_2$, dialkyl diacyloxysilanes, e.g., $(H_3CCOO)_2Si(CH_3)_2$, $(H_3CCOO)_2Si(C_2H_5)_2$, $(H_3CCOO)_2Si(C_3H_7)_2$ and $(H_3CCOO)_2Si(C_4H_9)_2$ and dihalogenosilanes, e.g., $Cl_2Si(CH_3)_2$, $Cl_2Si(C_2H_5)_2$, $Cl_2Si(C_3H_7)_2$, $Cl_2Si(C_4H_9)_2$, $Br_2Si(CH_3)_2$, $Br_2Si(C_2H_5)_2$, $Br_2Si(C_3H_7)_2$ and $Br_2Si(C_4H_9)_2$.

The silane compound for the present invention, represented by the general formula $R'_nSiX_{4-n}$ (XI), contains a tetra- or tri-functional silane compound as the essential component, and may contain a bi- functional silane compound as required. In particular, the preferable tetra-functional silane compound is tetraalkoxysilane, the preferable tri-functional silane compound is monoalkyl trialkoxysilane, and the preferable bi-functional silane compound is dialkyl dialkoxysilane.

The tetra- or tri-functional silane compound is incorporated preferably at 15 to 100%, more preferably 20 to 100%; bi-functional silane compound preferably at 0 to 85%, more preferably 0 to 80%; in particular, the tetra-functional silane compound more preferably at 15 to 100%, still more preferably 20 to 100%; tri-functional silane compound more preferably at 0 to 85%, still more preferably 0 to 80%; and bi-functional silane compound more preferably at 0 to 85%, still more preferably 0 to 80%, all percentages by mol.

The silicone polymer (D) for the present invention is produced, as described above, by hydrolysis and subsequent polycondensation of a silane compound, represented by the general formula (XI), preferably in the presence of an organic or inorganic acid or the like as the catalyst. The inorganic acids useful for the present invention include hydrochloric, sulfuric, phosphoric, nitric and hydrofluoric acid, and organic acids useful for the present invention include oxalic, maleic, sulfonic and formic acid. A Basic catalyst, e.g., ammonia or trimethyl ammonium, may be also used. The quantity of the catalyst to be used is adequately set in accordance with quantity of the silane compound represented by the general formula (XI). It is however used preferably at 0.001 to 0.5 mols per mol of the silane compound represented by the general formula (XI).

The hydrolysis and subsequent polycondensation are preferably effected in a solvent, in the presence of water, as required. The quantity of water to be used is set adequately. However, it is preferably used at 5 mols or less per mol of the silane compound represented by the general formula (XI), more preferably 0.5 to 4 mols, because some problems, e.g., deteriorated storage stability of the coating solution, may occur when it is present in an excessive quantity.

The silicone polymer is produced under the above conditions, while the composition is set in such a way that it is not gelled.

The silicone polymer is preferably dissolved in the same reaction solvent as described above before use for workability. Therefore, a solution may be used without exchange, or the silicone polymer may be dissolved in the above solvent after being separated from the effluent solution.

The inorganic filler (E) for the present invention is not limited. The fillers suitable for the present invention include alumina, titanium oxide, mica, silica, beryllia, barium titanate, potassium titanate, strontium titanate, calcium titanate, aluminum carbonate, aluminum hydroxide, aluminum silicate, calcium carbonate, calcium silicate, magnesium silicate, silicon nitride, boron nitride, clay (e.g., fired clay), talc, aluminum borate, and silicon carbide. These fillers may be used either individually or in combination. Shape and size of the inorganic filler are not limited. However, the suitably used one generally has a particle size of 0.01 to 50 μm, preferably 0.1 to 15 μm. The quantity of the inorganic filler is also not limited. However, it is preferably incorporated at 1 to 1,000 parts by weight per 100 parts by weight of total of the cyanate compound (A), phenol compound (B) and polyphenylene ether resin (C), which is used as required, more preferably 1 to 800 parts by weight.

The resin composition of the present invention is also characterized by containing the inorganic filler (F) which is the inorganic filler (F) surface-treated with the silicone polymer (D). Use of the surface-treated inorganic filler (F) brings the effect of the present invention more notably. The method of surface treatment of the inorganic filler with the silicone polymer (D) is not limited. The inorganic filler may be treated by the dry process in which the silicone polymer (D) and inorganic filler (E) are mixed directly with each other, or by the wet process in which the inorganic filler (E) is mixed with a diluted treatment solution of the silicone polymer (D). The quantity of the silicone polymer (D) deposited on the inorganic filler is not limited. However, generally it is preferably 0.01 to 20% by weight on the inorganic filler, more preferably 0.05 to 10%, still more preferably 0.1 to 7%. When it is below 0.01%, the inorganic filler may be insufficiently dispersed in the resin material, possibly deteriorating electrical insulation reliability of the resin composition. When it is above 20%, on the other hand, the resin composition may have deteriorated properties, e.g., heat resistance.

When the wet process, which uses the diluted treatment solution, is adopted for the surface treatment of the inorganic filler with the silicone polymer (D), the solvent for diluting the silicone polymer (D) is not limited. Suitable solvents for the present invention include alcohols, e.g., methanol, ethanol, ethylene glycol and ethylene glycol monomethyl ether; ketones, e.g., acetone, methylethylketone, methylisobutylketone and cyclohexanone; aromatic hydrocarbons, e.g., toluene, xylene and mesitylene; ester-based ones, e.g., methoxyethyl acetate, ethoxyethyl acetate, butoxyethyl acetate and ethyl acetate; amides, e.g., N-methylpyrrolidone, formamide, N-methylformamide, N,N-dimethylformamide and N,N-dimethylacetoamide; and nitrites and water. They may be used either individually or in combination.

When a solvent is used, its suitable quantity is not limited. However, it is generally set to keep the non-volatile content of the silicone polymer (D) at 0.01 to 90% by weight, preferably 0.01 to 80%. Surface treatment temperature is not limited. The inorganic filler may be treated at room temperature, or at the reflux temperature for the solvent used or lower.

When the inorganic filler is treated with the silicone polymer, the filler is preferably mixed with a solution of the silicone polymer, and use of the resultant mixture is preferable for workability. Care shall be taken not to completely set or gel the silicone polymer during the mixing step, for which mixing temperature is preferably set at room temperature to 200° C., more preferably 150° C. or lower.

The inorganic filler surface-treated with the silicone polymer may be produced by a procedure in which the inorganic filler is immersed in a solution of the silicone polymer, and the resultant filler coated with the polymer is separated and dried. Care shall be taken in this case to prevent the filler particles from agglomerating with each other due to the reaction with the polymer. For this reason, the drying temperature for the treatment is-preferably set at 50 to 200° C., more preferably 80 to 150° C., and the drying time is preferably set at 5 to 60 minutes, more preferably 10 to 30 minutes.

In the present invention, the inorganic filler may be surface-treated with a conventional coupling agent together with the silicone polymer (D). The coupling agents useful for the present invention include silane- and titanate-based ones. The silane-based coupling agents include epoxysilane-based ones, e.g., γ-glycidoxypropyltrimethoxy silane; aminosilane-based ones, e.g., hydrochloride of N-β-(N-vinyl-benzylaminoethyl)-γ-aminopropyltrimethoxysilane; and cationic silane-, vinyl silane-, acrylic silane- and mercapto silane-based one, and a mixture thereof. The suitable titanate-based coupling agents include isopropyltris(dioctylpyrophosphate) titanate. These coupling agents may be used either individually, or mixed in a desired ratio.

The ratio of the coupling agent to the silicone polymer, when the former is used, is not limited. However, a suitable ratio is generally 0.001:1 to 1:0.001 by weight, preferably 0.001:1 to 1:1, to allow them to efficiently exhibit their own characteristics.

Moreover, the resin composition of the present invention may be incorporated with a variety of resins or additives, e.g., flame-retardant (G), epoxy resin (H) or antioxidant (I), as required, within limits not harmful to characteristics of the resin composition, e.g., dielectric the properties or heat resistance, when it is used for a printed-wiring board.

The flame-retardant (G), when incorporated in the resin composition of the present invention, is not limited. It is particularly preferable to have no functional group reactive with the cyanate compound (A). It is also preferable, even if it is reactive with the cyanate compound (A), when it is a polymer having a sufficiently high molecular weight to exert only a limited effect of the functional group at the terminal, because such a flame-retardant is sufficiently low in reactivity with the cyanate compound (A) to provide the resin composition with flame-retardancy without damaging its dielectric properties after it is set. For example, suitable flame-retardants for the present invention include 1,2-dibromo-4-(1,2-dibromoethyl)cyclohexane, tetrabromocyclooctane, hexabromocyclododecane, bis(tribromophenoxy) ethane, a brominated triphenylcyanurate represented by the formula (VI), brominated polyphenylene ether represented by the formula (VII) and brominated polystyrene represented by the formula (VIII). The flame-retardant, when used, is incorporated preferably at 5 to 80 parts by weight per 100 parts by weight of total of the cyanate compound (A), phenol compound (B), and the components used as required, e.g., polyphenylene ether resin (C) and another resin material containing, as required, an additive (except for the inorganic filler), more preferably 5 to 60 parts, and still more preferably 5 to 50 parts. The resin composition may not have sufficient flame-retardancy, when the retardant is incorporated at below 5 parts by weight. On the other hand, it may not have sufficient heat resistance after being set, if it is incorporated at above 80 parts by weight:

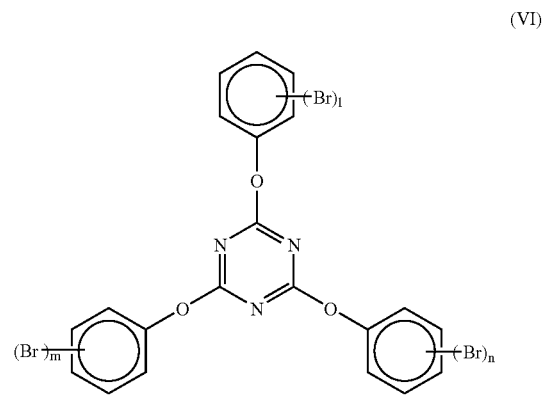

(VI)

(wherein, "l," "m," and "n" are each an integer of 1 to 5)

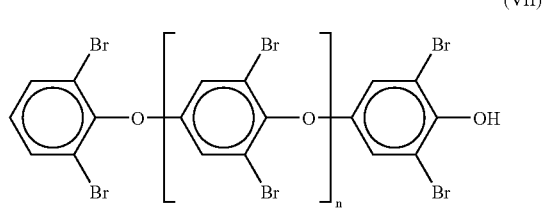

(VII)

(wherein, "n" is an integer of 1 to 5)

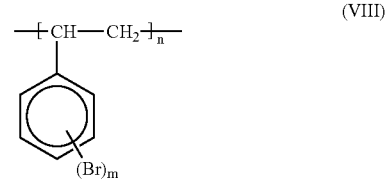

(VIII)

(wherein, "m," is an integer of 1 to 5, and "n" is an integer).

The epoxy rein (H), when incorporated in the resin composition of the present invention, is not limited. Those epoxy resins suitably used for the epoxy resin (H) include bisphenol A type epoxy resin, brominated bisphenol A type epoxy resin, phenol novolac type epoxy resin, cresol novolac type epoxy resin, bisphenol A novolac type epoxy resin, biphenyl type epoxy resin, epoxy resin having a naphthalene structure, epoxy resin having an aralkyl structure, phenol salicylaldehyde novolac type epoxy resin represented by the following formula (IX), which may be substituted by a lower alkyl group, and epoxy resin having a cyclopentadiene structure, represented by the following formula (X):

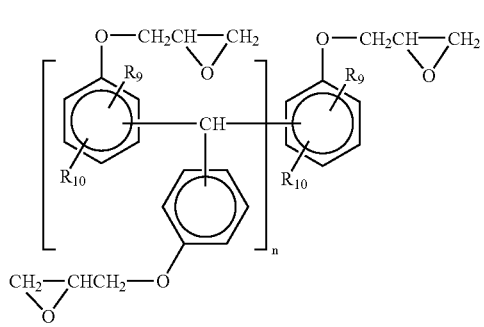

(wherein, $R_9$ is hydrogen atom or an alkyl group of 1 to 4 carbon atoms; $R_{10}$ is an alkyl group of 1 to 4 carbon atoms; and "n" is an average of 1 to 7)

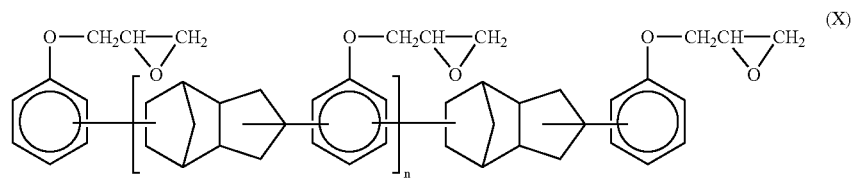

(wherein, "n" is an integer).

The quantity of the epoxy resin, when used, is not limited.

However, it is incorporated preferably to have 1.2 equivalents or less of the glycidyl group in the epoxy resin per equivalent of the cyanato group in the cyanate compound (A), more preferably 1 equivalent or less. Incorporation of the epoxy resin to have an equivalence ratio above 1.2 may deteriorate dielectric properties of the resultant resin composition in a high-frequency bandwidth.

The antioxidant (I), when used, is selected from the group consisting of a phenol-based one and organosulfur-base one. The inventors of the present invention have found that incorporation of the antioxidant controls metal migration in the resin composition, when it is set or formed into a laminate, thereby further improving its insulation reliability. The specific examples of the phenol-based antioxidants useful for the present invention include monophenol-based ones, e.g., pyrogallol, butylated hydroxyanisole and 2,6-di-tert-butyl-4-methylpohenol; bisphenol-based ones, e.g., 2,2'-methylene-bis-(4-methyl-6-tert-butyl phenol and 4,4'-thio-bis-(3-methyl-6-tert-butyl phenol; and polymer type phenol-based ones, e.g., 1,3,5-trimethyl-2,4,6-tris(3,5-di-tert-butyl-4-hydroxybenzyl)benzene and tetrakis-[methylene-3-(3'-5'-di-tert-butyl-4'-hydroxyphenyl)propionate]methane. The specific examples of the organosulfur-based antioxidants include dilauryl thiodipropionate and distearyl thiodipropionate. These antioxidants may be used either individually or in combination. The antioxidant, when used, is incorporated preferably at 0.1 to 30 parts by weight per 100 parts by weight of total of the cyanate compound (A), phenol compound (B), and the components used as required, e.g., polyphenylene ether resin (C) and another resin material containing, as required, an additive (except for the inorganic filler). The resin composition may not exhibit improved dielectric properties, when the antioxidant is incorporated at below 0.1 parts by weight. On the other hand, its dielectric properties may be conversely deteriorated, when it is incorporated at above 30 parts by weight.

The resin composition of the present invention may be further incorporated with a metal-based reaction catalyst, to promote reaction of the cyanate compound (A). This catalyst works to promote the setting reaction between the cyanate compound (A) and phenol compound (B), and is used as the reaction promoter for production of the phenol-modified cyanate ester oligomer and phenol-modified cyanate ester oligomer containing the polyphenylene ether resin for the present invention, or as the setting promoter for production of the laminate. The metal-based catalysts useful for the present invention include those based on manganese, iron, cobalt, nickel, copper or zinc. More specifically, these metals are in the form of organometal salt, e.g., 2-ethylhexanoate or naphthenate; or organometal complex, e.g., acetylacetone complex. The process for producing the phenol-modified cyanate ester oligomer or phenol-modified cyanate ester oligomer containing the polyphenylene ether resin and that for producing the laminate may use the same metal-based reaction catalyst as the reaction promoter and setting promoter, respectively, or different catalysts. Moreover, each process may use one or more types of catalysts. The metal-based reaction catalyst may be incorporated in the process for producing the phenol-modified cyanate ester oligomer or phenol-modified cyanate ester oligomer containing the polyphenylene ether resin in a quantity required for promoting the reaction in this process and for promoting the setting reaction in the subsequent process for producing the laminate. Or else, the catalyst may be incorporated in the former process in a quantity required for promoting the reaction in that process, and the same or a different one or a mixture thereof in the subsequent process in a quantity for the remaining setting reaction in that process.

When the epoxy resin (H) is incorporated in the resin composition of the present invention, it may be used together with a compound having a catalytic function to promote reaction of the glycidyl group. Compounds useful for the present invention include alkali metal compounds, alkali-earth metal compounds, imidazole compounds, organophosphorus compounds, secondary amines, tertiary amines and quaternary ammonium salts. They may be used either individually or in combination.

The resin composition of the present invention, when set under heating, can be used for producing a metal-clad laminate for printed-wiring boards, excellent in dielectric characteristics and heat resistance. More specifically, a base material, e.g., glass cloth, is impregnated with the resin composition of the present invention or varnish of the resin composition dissolved or dispersed in a solvent, dried normally at 80 to 200° C. by a drying furnace or the like (or at temperature at which the solvent can be evaporated or higher, when the solvent is used), preferably 100 to 180° C., for 3 to 30 minutes, preferably 3 to 15 minutes, to prepare the prepreg. Next, the two or more prepreg sheets are placed one on another to produce the laminate, which is formed under heating, after being coated with a metallic foil on at least one side, to produce the metal-clad laminate.

The solvent useful for dissolving or dispersing the resin composition of the present invention to produce the varnish is not limited. More specifically, the solvents useful for the present invention include alcohols, e.g., methanol, ethanol, ethylene glycol and ethylene glycol monomethyl ether; ketones, e.g., acetone, methylethylketone, methylisobutylketone and cyclohexanone; aromatic hydrocarbons, e.g., toluene, xylene and mesitylene; ester-based ones, e.g., methoxyethyl acetate, ethoxyethyl acetate, butoxyethyl acetate and ethyl acetate; and amides, e.g., N-methylpyrrolidone, formamide, N-methylformamide, N,N-dimethylformamide and N,N-dimethylacetoamide. They may be used either individually or in combination. Of these solvents, a mixed solvent of the aromatic hydrocarbon (e.g., toluene, xylene or mesitylene) and ketone (e.g., acetone, methylethylketone, methylisobutylketone or cyclohexanone) is more preferable for producing the varnish of high non-volatile content and low viscosity, when an inorganic filler treated with the silicone polymer for the present invention is used.

The resin composition of the present invention, when used for producing the varnish, may be dissolved or dispersed in the above solvent, and further incorporated, as required, with a variety of resins or additives, e.g., flame-retardant (G), epoxy resin (H) or antioxidant (I).

The varnish may be produced by incorporating the cyanate compound (A) or resin material containing the phenol-modified cyanate oligomer and phenol compound (B), in the treatment solution with the silicone polymer (D) dissolved in a solvent, in which the inorganic filler (E) is surface-treated beforehand.

It may be also produced by dissolving or dispersing the cyanate compound (A) or resin material containing the phenol-modified cyanate oligomer and phenol compound (B), and then incorporating, in the resultant solution or dispersion, the treatment solution containing the inorganic filler (F) surface-treated with the silicone polymer (D) dissolved in a solvent, where the above solution or dispersion may be further incorporated, as required, with a variety of resins or additives, e.g., flame-retardant (G), epoxy resin (H) or antioxidant (I).

It may be also produced by incorporating, in the treatment solution containing: the surface-treated inorganic filler (F), cyanate compound (A), resin material containing the phenol-modified cyanate oligomer and phenol compound (B) and polyphenylene ether resin (C); or resin material containing the phenol-modified cyanate oligomer containing the polyphenylene ether resin, produced in the presence of the polyphenylene ether resin (C), and the phenol compound (B), where the above treatment solution may be further incorporated, as required, with a variety of resins or additives, e.g., flame-retardant (G), epoxy resin (H) or antioxidant (I).

It may be also produced by incorporating the inorganic filler (F) surface-treated with the silicone polymer (D) or treatment solution containing the inorganic filler (F) surface-treated with the silicone polymer (D) in the solvent which dissolves or disperses resin materials containing the cyanate compound (A) or the phenol-modified cyanate oligomer, phenol compound (B) and polyphenylene ether resin (C), or resin material containing the phenol-modified cyanate oligomer containing the polyphenylene ether resin, produced in the presence of the polyphenylene ether resin (C), and the phenol compound (B), where the above solvent may further dissolve or disperse, as required, a variety of resins or additives, e.g., flame-retardant (G), epoxy resin (H) or antioxidant (I).

For production of the varnish, the phenol-modified cyanate oligomer may be used in the form of solution produced by reacting the cyanate compound (A) with the phenol compound (B) in a solvent, or the phenol-modified cyanate oligomer containing the polyphenylene ether resin may be used in the form of solution produced by reacting the cyanate compound (A) with the phenol compound (B) in the solvent which disperses or dissolves the polyphenylene ether resin (C) beforehand.

In general, dielectric properties of a high-molecular-weight material or the like are very sensitive to the effect of oriented polarization. It is therefore possible to reduce its dielectric constant by reducing the polar group in the molecule, or to reduce its dielectric loss tangent by controlling movement of the polar group. Although containing high-polarity cyanato group, a cyanate ester resin, when set, has a characteristic of low relative dielectric constant and dielectric loss tangent for a thermosetting resin, because it is set with the cyanato group being consumed to form a symmetric, rigid triazine structure.

However, the cyanato group in the cyanate ester resin alone cannot be totally reacted to form the triazine structure, and left as the unreacted cyanato group in the reaction system, which loses fluidity as the setting reaction proceeds. As a result, the set product only has a relative dielectric constant and dielectric loss tangent higher than those which it could attain. Moreover, the cyanate ester resin alone has problems, for example, deteriorated fabricability, because of the sufficient hardness and fragileness, and deteriorated heat resistance while it is absorbing moisture, because of the high-polarity cyanato group left to increase its water absorptivity.

Attempts have been made to improve fabricability and heat resistance while the resin is absorbing moisture by incorporating an epoxy resin, polyvalent phenol compound, imide or the like in the cyanate ester resin. However, they involve their own disadvantages, e.g., the formation of a high-polarity structure other than the triazine ring by the reaction of the cyanato group, and deteriorated dielectric properties of the resin composition, because of decreased fluidity of the reaction system as the setting reaction proceeds with the result that the unreacted functional group (e.g., cyanato, glycidyl, hydroxyl or imide) tends to be left in the system. These disadvantages are more notable when the resin composition is used in a high-frequency bandwidth exceeding 1 GHz. Incorporation of a polyvalent phenol compound in the cyanate ester resin can improve the fabricability of the resultant resin composition, but will greatly decrease its storage stability (pot life). Moreover, the rapid reaction occurring during the resin setting process greatly decreases its fluidity, preventing efficient production of the triazine ring, and tending to leave the unreacted cyanato group or hydroxyl group in the polyvalent phenol compound and hence conversely deteriorate dielectric properties of the resin composition.

By contrast, the resin composition of the present invention is incorporated with an adequate quantity of the cyanate compound and, in particular, monovalent phenol compound to efficiently form the triazine ring. At the same time, the cyanato group left unreacted in the resin composition is imido-carbonated to reduce its polarity, thereby reducing the relative dielectric constant and dielectric loss tangent of the resin composition after it is set. Moreover, the inventors of the present invention have found that the reaction between the cyanate compound and phenol compound forms the triazine ring which contains a component derived from the phenol compound. In the common setting process in which the cyanate ester alone is set, because the triazine ring has 3 cyanato groups, the triazine ring will invariably serve as the crosslinking point as the reaction proceeds. By contrast, the triazine ring will not serve as the crosslinking point in the resin composition of the present invention, composed of the cyanate compound and monovalent phenol compound, or of the phenol-modified cyanate ester oligomer, because one or more molecules of the monovalent phenol compound incorporated are included as the constituent component in the triazine ring to decrease number of the cyanato group extending from the triazine ring to 1 or 2. Therefore, the set resin composition of the present invention characteristically has a larger molecular weight between the crosslinking points and a lower crosslinking density than the set product of the common cyanate ester. The resin composition of the present invention increases in viscosity to a lower extent as the setting reaction proceeds, because of its larger molecular weight between the crosslinking points. Therefore, the reaction system has a longer time before it loses fluidity, keeping the cyanato group reactive for a longer time and forming the triazine ring more efficiently. As a result, the set resin composition can have improved dielectric properties, because of the reduced quantity of the unreacted cyanato group left in the composition. It is considered that the monovalent phenol compound is more suitable for achieving the above objects, because of its high reactivity with the cyanato group, mono-functionality and relatively low molecular weight, and high compatibility with the cyanate ester resin. The phenol compound (B) described earlier as one suitable for the present invention is selected for the above reasons.

A phenol compound, e.g., nonyl phenol, has been used as a promoter for trimerization of a cyanate ester (to form the triazine ring) at around 0.005 to 0.01 equivalents per equivalent of the cyanate compound. However, it rarely brings the effect of reducing polarity by the reaction of the unreacted cyanato group, because it is used in a catalyst quantity. On the other hand, the inventors of the present invention have found, after having studied quantity of the phenol compound to be used, that incorporation of a larger quantity of the phenol compound reduces the relative dielectric constant and dielectric loss tangent of the set product, and that use of the monovalent phenol compound, described earlier as the one suitable for the present invention, can control the deterioration of its heat resistance resulting from increased quantity of the phenol compound. Therefore, the process of the present invention gives the set resin composition having a lower relative dielectric constant and dielectric loss tangent than the conventional set products, e.g., that of the cyanate ester alone, or that of the resin incorporated with an epoxy resin, polyvalent phenol compound, imide or the like.

The resin composition of the present invention can have still improved dielectric properties, when incorporated with a polyphenylene ether resin, which is known as a thermoplastic resin of good dielectric properties. A cyanate ester resin and polyphenylene ether resin are inherently incompatible with each other, and do not easily provide a uniform resin. The resin composition of the present invention can have a uniform structure due to its so-called "semi-interpenetrating polymer network (semi-IPN), in which the setting component as one component is crosslinked in the presence of the polymer (polyphenylene ether resin in this case) as the other component while the resin composition is being set or the phenol-modified cyanate oligomer containing the polyphenylene ether resin is being produced. It is considered that these components are eventually made compatible with each other to form a uniform structure not via the chemical bond but by oligomerization of the resin as one component while being entwined with the molecular chains in the polymer. It is considered to be advantageous for the resin composition to have the semi-IPN structure that the reaction of the crosslinking component proceeds in such a way to allow the crosslinking component to be entwined more easily with the molecular chains in the polymer. In this regard, the inventors of the present invention have found that the phenol-modified cyanate ester resin as the crosslinking component for the present invention is easily entwined with the polyphenylene ether resin as the polymer component, because the former has a longer molecular chain (or a larger molecular weight) between the crosslinking points than the common set product of a cyanate ester alone, as described earlier, with the result that these components become more compatible with each other (the triazine ring appears like a "knot" in each of the shorter molecular chain in the common set product of a cyanate ester resin alone).

The laminate or printed-wiring board of the resin composition of the present invention, when incorporated with, as an essential component, an inorganic filler surface-treated with a silicone polymer, has a layer of the surface treatment agent sufficiently covering the inorganic filler particles at the interface between the inorganic filler and resin material, instead of a thin, rigid layer of surface treatment agent formed in the common process which uses a coupling agent or the like, where the surface treatment agent layer in the resin composition of the present invention works as a cushion formed by the three-dimensionally crosslinked silicone polymer. As a result, the inorganic filler particles agglomerate with each other less easily than in the conventional resin containing a coupling agent, and hence are dispersed more uniformly in the resin. Moreover, the surface treatment agent layer works to relax the strain generated at the interface between the inorganic filler and resin material, performing a function of enabling the excellent adhesion property interest to which the resin inherently has. Therefore, the laminate and the printed-wiring board of the resin composition of the present invention can exhibit excellent characteristics, e.g., low water absorptivity, high drill-machinability and high insulation reliability.

It is generally difficult to produce a varnish of high non-volatile content and low viscosity, when a resin composition containing a polyphenylene ether known as a high-molecular-weight polymer is used. In other words, a varnish containing a polyphenylene ether invariably has a problem of high solvent content, because it will solidify to become a grease at normal temperature as its non-volatile content increases. Use of a varnish of a low non-volatile content to coat a base of glass cloth or the like to produce a prepreg will cause problems of deteriorated appearance of the resultant prepreg, decreased heat resistance of the laminate for which the prepreg is used, because of increased quantity of the solvent remaining in the prepreg, and difficulty in securing the prepreg of desired resin content and thickness, because of the limited quantity of resin deposited on the base of glass cloth or the like. By contrast, the resin composition of the present invention can be controlled for hydrophobicity (hydrophilicity) of the silicone polymer as its component for specific characteristics of the resin material and solvent by adequately selecting the siloxane unit which constitutes the silicone polymer. Therefore, the inorganic filler treated with the silicone polymer, when used for the resin composition of the present invention, works to adequately control interaction (interfacial tension) between the resin material and solvent, resin material and inorganic filler, and inorganic filler and solvent by the action of the silicone polymer, bringing the advantages of increased non-volatile content and improved workability of the varnish for which the composition is used, the latter advantage resulting from the adequately controlled viscosity.

It is also observed: that the set resin composition of the present invention has a decreased dielectric constant and tangent, when a sufficient quantity of the phenol compound is incorporated; that use of the monovalent phenol compound can control decreases in resistance of the composition to heat, where the decrease comes from increased content of the silicone compound; and that foaming problems do not occur while the prepreg of the composition is being handled.

The present invention is described more specifically by EXAMPLES, which by no means limit the present invention.

EXAMPLE 1

(Preparation of the Cyanate Resin Solution)

A 2-liter four-mouthed separable flask equipped with a thermometer, cooling tube and stirrer was charged with 231 g of toluene, 500 g of 2,2-bis(4-cyanatephenyl)propane (manufactured by ASAHI CIBA CORPORATION; Arocy B-10) and 37.7 g of p-tert-butyl phenol (manufactured by Kanto Chemical Co., Inc.). The mixture was then incorporated with 0.13 g of manganese naphthenate (manufactured by Wako Pure Chemical Industries, Ltd.) as a reaction promoter, after it was confirmed to be homogeneous and kept at 110° C., and heated for 2 hours to synthesize the phenol-modified cyanate oligomer solution, where the reaction process was controlled to have a 2,2-bis(4-cyanatophenyl)propane conversion of about 50%. This solution was used as the cyanate resin solution. The 2,2-bis(4-cyanatophenyl)propane conversion was 51%, which was confirmed by gel permeation chromatography (GPC) (Chromatograph: pump; manufactured by Hitachi, Ltd; L-6200, RI detector; L-3300, and columns: Manufactured by TOSOH CORPORATION; TSKgel-G4000H and 2000H, solvent: THF, concentration: 1%). The same chromatograph was used in all EXAMPLES. It was also confirmed that the elution peak of p-tert-butyl phenol disappeared, in all EXAMPLES.

(Preparation of the Inorganic Filler Treated with the Silicone Polymer)

A 200-mL four-mouthed flask equipped with a thermometer, cooling tube and stirrer was charged with 16 g of tetramethoxysilane and 24 g of methanol, to which 0.21 g of acetic acid and 4.0 g of distilled water were added, and the mixture was stirred at 50° C. for 8 hours to synthesize the silicone polymer with the siloxane unit having a polymerization degree of 20 (polymerization degree was estimated from number-average molecular weight determined by GPC in all EXAMPLES). The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 371 g of methylethylketone and 915 g of silica (average particle size: 0.5 μm) as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler surface-treated with the silicone polymer was incorporated with the cyanate resin solution prepared above, and the mixture was stirred at 65° C. for 1 hour to dissolve and disperse the cyanate resin. The resultant solution was cooled to room temperature, and incorporated with 0.06 g of zinc naphthenate (manufactured by Wako Pure Chemical Industries, Ltd.) as a setting promoter and 161 g of methylethylketone, to prepare the resin varnish containing non-volatile content at around 65%.

EXAMPLE 2

(Preparation of the Cyanate Resin Solution)

A 2-liter four-mouthed separable flask equipped with a thermometer, cooling tube and stirrer was charged with 273 g of toluene, 500 g of bis(3,5-dimethyl-4-cyanatephenyl)methane (manufactured by ASAHI CIBA CORPORATION; Arocy M-10) and 40.1 g of p-tert-octyl phenol. The mixture was then incorporated with 0.25 g of cobalt naphthenate as a reaction promoter, after it was confirmed to be homogeneous and kept at 110° C., and heated for 2 hours to synthesize the phenol-modified cyanate oligomer solution, where the reaction process was controlled to have a bis(3,5-dimethyl-4-cyanatephenyl)methane conversion of 50%. The resultant synthetic solution was incorporated with 97 g of polystyrene bromide (manufactured by Great Lakes Chemical Corporation; PDBS-80) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 21 g of trimethoxymethylsilane and 31 g of methanol, to which 0.19 g of acetic acid and 5.3 g of distilled water were added, and the mixture was stirred at 50° C. for 8 hours to synthesize the silicone polymer with the siloxane unit having a polymerization degree of 15. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 464 g of methylethylketone and 1148 g of the same silica as used in EXAMPLE 1 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 0.06 g of zinc naphthenate as a setting promoter and 199 g of methylethylketone, to prepare the resin varnish containing non-volatile content at around 65%.

EXAMPLE 3

(Preparation of the Cyanate Resin Solution)

A 2-liter four-mouthed separable flask equipped with a thermometer, cooling tube and stirrer was charged with 263 g of toluene, 500 g of α,α'-bis(4-cyanatophenyl)-m-diisopropylbenzene (manufactured by ASAHI CIBA CORPO- RATION; RTX-366) and 10.4 g of p-tert-octyl phenol. The mixture was then incorporated with 0.15 g of iron naphthenate (manufactured by Kanto Chemical Co., Inc.) as a reaction promoter, after it was confirmed to be homogeneous and kept at 110° C., and heated for 2 hours to synthesize the phenol-modified cyanate oligomer solution, where the reaction process was controlled to have an α,α'-bis(4-cyanatophenyl)-m-diisopropylbenzene conversion of 49%. The resultant synthetic solution was incorporated with 103 g of brominated polyphenylene ether (manufactured by Great Lakes Chemical Corporation; PO-64P) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 6.5 g of dimethoxydimethylsilane, 13 g of trimethoxymethylsilane and 29 g of methanol, to which 0.23 g of acetic acid and 4.9 g of distilled water were added, and the mixture was stirred at 50° C. for 8 hours to synthesize the silicone polymer with the siloxane unit having a polymerization degree of 18. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 520 g of methylethylketone and 1272 g of the same silica as used in EXAMPLE 1 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 22.7 g of p-tert-amyl phenol (manufactured by TOKYO KASEI KOGYO CO., LTD), 0.06 g of zinc naphthenate as a setting promoter and 222 g of methylethylketone, to prepare the resin varnish containing non-volatile content at around 65%.

EXAMPLE 4

(Preparation of the Cyanate Resin Solution)

A 2-liter four-mouthed separable flask equipped with a thermometer, cooling tube and stirrer was charged with 254 g of toluene, 500 g of 2,2-bis(4-cyanatophenyl)propane and 11.4 g of p-(α-cumyl)phenol (manufactured by TOKYO KASEI KOGYO CO., LTD). The mixture was then incorporated with 0.13 g of zinc naphthenate as a reaction promoter, after it was confirmed to be homogeneous and kept at 110° C., and heated for 3 hours to synthesize the phenol-modified cyanate oligomer solution, where the reaction process was controlled to have a 2,2-bis(4-cyanatophenyl)propane conversion of 50%. The resultant synthetic solution was incorporated with 82 g of brominated triphenyl cyanurate (manufactured by Dai-ichi Kogyo Seiyaku Co., Ltd; Pyroguard SR-245) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 10 g of dimethoxydimethylsilane, 12 g of tetramethoxysilane and 33 g of methanol, to which 0.3 g of acetic acid and 5.7 g of distilled water were added, and the mixture was stirred at 50° C. for 8 hours to synthesize the silicone polymer with the siloxane unit having a polymerization degree of 28. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 443 g of methylethylketone and 1102 g of the same silica as used in EXAMPLE 1 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 19.0 g of p-(α-cumyl)phenol, 0.06 g of zinc naphthenate as a setting promoter and 200 g of methylethylketone, to prepare the resin varnish containing non-volatile content at around 65%.

EXAMPLE 5

(Preparation of the Cyanate Resin Solution)

A 2-liter four-mouthed separable flask equipped with a thermometer, cooling tube and stirrer was charged with 262 g of toluene, 500 g of bis(3,5-dimethyl-4-cyanatephenyl)methane and 31.9 g of p-tert-amyl phenol (manufactured by TOKYO KASEI KOGYO CO., LTD). The mixture was then incorporated with 0.13 g of zinc naphthenate as a reaction promoter, after it was confirmed to be homogeneous and kept at 110° C., and heated for 2 hours to synthesize the phenol-modified cyanate oligomer solution, where the reaction process was controlled to have a bis(3,5-dimethyl-4-cyanatephenyl)methane conversion of 49%. The resultant synthetic solution was incorporated with 79 g of bis(tribromophenoxy)ethane (manufactured by Great Lakes Chemical Corporation; FF-680) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 6.5 g of trimethoxymethylsilane, 8 g of tetramethoxysilane and 21 g of methanol, to which 0.16 g of acetic acid and 3.6 g of distilled water were added, and the mixture was stirred at 50° C. for 8 hours to synthesize the silicone polymer with the siloxane unit having a polymerization degree of 22. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 413 g of methylethylketone and 1008 g of the same silica as used in EXAMPLE 1 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 0.06 g of zinc naphthenate as a setting promoter and 179 g of methylethylketone, to prepare the resin varnish containing non-volatile content at around 65%.

EXAMPLE 6

(Preparation of the Cyanate Resin Solution)

A 2-liter four-mouthed separable flask equipped with a thermometer, cooling tube and stirrer was charged with 175 g of toluene, 400 g of 2,2-bis(4-cyanatophenyl)propane and 8.6 g of p-tert-bytyl phenol. The mixture was then incorporated with 0.1 g of manganese naphthenate as a reaction promoter, after it was confirmed to be homogeneous and kept at 110° C., and heated for 3 hours to synthesize the phenol-modified cyanate oligomer solution, where the reaction process was controlled to have a 2,2-bis(4-cyanatophenyl)propane conversion of 52%. The resultant synthetic solution was used as the cyanate resin solution.

(Preparation of the Inorganic Filler Treated with the Silicone Polymer)

A 200-mL four-mouthed flask equipped with a thermometer, cooling tube and stirrer was charged with 10 g of dimethoxydimethylsilane, 10 g of trimethoxymethylsilane, 20 g of tetramethoxysilane and 59 g of methanol, to which 0.51 g of acetic acid and 10 g of distilled water were added, and the mixture was stirred at 50° C. for 8 hours to synthesize the silicone polymer with the siloxane unit having a polymerization degree of 23. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 1282 g of methylethylketone and 3120 g of strontium titanate (average particle size: 1.0 μm) as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above and 460 g of brominated bisphenol A type epoxy resin (manufactured by Sumitomo Chemical Company, Ltd; ESB400T) as the epoxy resin, and the mixture was stirred at 65° C. for 1 hour to dissolve and disperse the cyanate resin. The resultant solution was cooled to room temperature, and incorporated with 21.9 g of p-(α-cumyl)phenol, 0.05 g of zinc naphthenate as a setting promoter and 652 g of methylethylketone, to prepare the resin varnish containing non-volatile content at around 65%.

EXAMPLE 7

(Preparation of the Cyanate Resin Solution)

A 2-liter four-mouthed separable flask equipped with a thermometer, cooling tube and stirrer was charged with 177 g of toluene, 400 g of 2,2-bis(4-cyanatophenyl)-1,1,1,3,3,3-hexafluoropropane (manufactured by ASAHI CIBA CORPORATION; Arocy F-10) and 12.8 g of p-tert-octyl phenol. The mixture was then incorporated with 0.1 g of manganese naphthenate as a reaction promoter, after it was confirmed to be homogeneous and kept at 110° C., and heated for 3 hours to synthesize the phenol-modified cyanate oligomer solution, where the reaction process was controlled to have a 2,2-bis(4-cyanatophenyl)-1,1,1,3,3,3-hexafluoropropane conversion of 50%. The resultant synthetic solution was used as the cyanate resin solution.

(Preparation of the Inorganic Filler Treated with the Silicone Polymer)

A 5-liter four-mouthed flask equipped with a thermometer, cooling tube and stirrer was charged with 33.2 g of the solution prepared in the same manner as in EXAMPLE 1 to contain the silicone polymer, 6 g of γ-glycidoxypropyltrimethoxysilane (manufactured by Nippon Unicar Co., Ltd; A-187) as a silane-based coupling agent at a ratio of the silicone polymer to A-187 of 2:1 by weight, 555 g of methylethylketone, and 1331 g of the same silica as used in EXAMPLE 1 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above and 266 g of an epoxy resin containing a dicyclopentadiene structure (manufactured by Dainippon Ink and Chemicals, Inc.; HP-7200) as the epoxy resin, and the mixture was stirred at 65° C. for 1 hour to dissolve and disperse the cyanate resin. The resultant solution was cooled to room temperature, and incorporated with 21.4 g of p-tert-octyl phenol, 0.05 g of zinc naphthenate as a setting promoter and 348 g of methylethylketone, to prepare the resin varnish containing non-volatile content at around 65%.

EXAMPLE 8

A 2-liter four-mouthed flask equipped with a thermometer, cooling tube and stirrer was charged with the cyanate resin solution prepared in the same manner as in EXAMPLE 1 and 532 g of methylethylketone, and the mixture was stirred at 65° C. for 1 hour to dissolve the cyanate resin. The resultant solution was incorporated with the solution prepared in the same manner as in EXAMPLE 1 to contain the silicone polymer, and stirred for 30 minutes, to which 915 g of the same silica as used in EXAMPLE 1 was added as the inorganic filler, and the mixture was stirred for 1 hour to disperse the inorganic filler. The resultant solution was cooled to room temperature, and incorporated with 0.06 g of zinc naphthenate as a setting promoter, to prepare the resin varnish containing non-volatile content at around 65%.

EXAMPLE 9

(Preparation of the Cyanate Resin Solution)

A 3-liter four-mouthed separable flask equipped with a thermometer, cooling tube and stirrer was charged with 172 g of toluene, 400 g of 2,2-bis(4-cyanatophenyl)propane (manufactured by ASAHI CIBA CORPORATION; Arocy B-10) and 30.2 g of p-tert-butyl phenol (manufactured by Kanto Chemical Co., Inc.). The mixture was then incorporated with 0.1 g of manganese naphthenate (manufactured by Wako Pure Chemical Industries, Ltd.) as a reaction promoter, after it was confirmed to be homogeneous and kept at 110° C., and heated for 1 hour to synthesize the phenol-modified cyanate oligomer solution. Conversion of the 2,2-bis(4-cyanatophenyl)propane was 41%, which was confirmed by gel permeation chromatography (GPC) (Chromatograph: pump; manufactured by Hitachi, Ltd; L-6200, RI detector; L-3300, and columns, Manufactured by TOSHO CORPORATION, TSKgel-G4000H and 2000H, solvent: THF, concentration: 1%). The same chromatograph was used in all EXAMPLES. It was also confirmed that the elution peak of p-tert-butyl phenol disappeared, in all EXAMPLES. The synthesized solution was incorporated with a solution of 320 g of a polyphenylene ether resin (manufactured by GE plastics Japan Ltd; PKN4752) dissolved in 442 g of toluene under heating at 90° C., to prepare the cyanate resin solution.

(Preparation of the Inorganic Filler Treated with the Silicone Polymer)

A 200-mL four-mouthed flask equipped with a thermometer, cooling tube and stirrer was charged with 22 g of tetramethoxysilane and 33 g of methanol, to which 0.29 g of acetic acid and 5.6 g of distilled water were added, and the mixture was stirred at 50° C. for 8 hours to synthesize the silicone polymer with the siloxane unit having a polymerization degree of 20 (polymerization degree was estimated from number-average molecular weight determined by GPC in all EXAMPLES). The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 518 g of methylethylketone and 1275 g of silica (average particle size: 0.5 µm) as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler surface-treated with the silicone polymer was incorporated with the cyanate resin solution prepared above, and the mixture was stirred at 65° C. for 1 hour to dissolve and disperse the cyanate resin. The resultant solution was cooled to room temperature, and incorporated with 0.05 g of zinc naphthenate (manufactured by Wako Pure Chemical Industries, Ltd.) as a setting promoter and 506 g of methylethylketone, to prepare the resin varnish containing non-volatile content at around 56%.

EXAMPLE 10

(Preparation of the Cyanate Resin Solution)

A 3-liter four-mouthed separable flask equipped with a thermometer, cooling tube and stirrer was charged with 293 g of toluene, 400 g of bis(3,5-dimethyl-4-cyanatephenyl)methane (manufactured by ASAHI CIBA CORPORATION; Arocy M-10) and 32.1 g of p-tert-octyl phenol. The mixture was then incorporated with 0.15 g of cobalt naphthenate (manufactured by Wako Pure Chemical Industries, Ltd.) as a reaction promoter, after it was confirmed to be homogeneous and kept at 110° C., and heated for 1 hour to synthesize the phenol-modified cyanate oligomer solution, where the bis(3,5-dimethyl-4-cyanatephenyl)methane was converted at a rate of 40%. The resultant synthetic solution was incorporated with a solution of 300 g of polyphenylene ether resin (PKN4752) dissolved in 414 g of toluene under heating at 90° C. and 132 g of polystyrene bromide (manufactured by Great Lakes Chemical Corporation; PDBS-80) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 29 g of trimethoxymethylsilane and 43 g of methanol, to which 0.26 g of acetic acid and 7.2 g of distilled water were added, and the mixture was stirred at 50° C. for 8 hours to synthesize the silicone polymer with the siloxane unit having a polymerization degree of 15. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 629 g of methylethylketone and 1556 g of the same silica as used in EXAMPLE 9 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 0.05 g of zinc naphthenate as a setting promoter and 538 g of methylethylketone, to prepare the resin varnish containing non-volatile content at around 57%.

EXAMPLE 11

(Preparation of the Cyanate Resin Solution)

A 3-liter four-mouthed separable flask equipped with a thermometer, cooling tube and stirrer was charged with 550 g of toluene and 255 g of a polyphenylene ether resin (PKN4752), and the mixture was stirred under heating at 90° C. to dissolve the resin. It was then incorporated with 300 g of α,α'-bis(4-cyanatophenyl)-m-diisopropylbenzene (manufactured by ASAHI CIBA CORPORATION; RTX-366) and 6.2 g of p-tert-octyl phenol. The mixture was then incorporated with 0.1 g of iron naphthenate (manufactured by Kanto Chemical Co., Inc.) as a reaction promoter, after it was confirmed to be homogeneous and kept at 110° C., and heated for 1 hour to synthesize the phenol-modified cyanate oligomer solution containing the polyphenylene ether resin, where the α,α'-bis(4-cyanatophenyl)-m-diisopropylbenzene was converted at a rate of 39%. The resultant synthetic solution was incorporated with 111 g of brominated polyphenylene ether (manufactured by Great Lakes Chemical Corporation; PO-64P) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 7 g of dimethoxydimethylsilane, 14 g of trimethoxymethylsilane and 32 g of methanol, to which 0.25 g of acetic acid and 5.3 g of distilled water were added, and the mixture was stirred at 50° C. for 8 hours to synthesize the silicone polymer with the siloxane unit having a polymerization degree of 18. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 560 g of methylethylketone and 1371 g of the same silica as used in EXAMPLE 9 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 13.6 g of p-tert-amyl phenol (manufactured by TOKYO KASEI KOGYO CO., LTD), 0.04 g of zinc naphthenate as a setting promoter and 624 g of methylethylketone, to prepare the resin varnish containing non-volatile content at around 54%.

EXAMPLE 12

(Preparation of the Cyanate Resin Solution)

A 3-liter four-mouthed separable flask equipped with a thermometer, cooling tube and stirrer was charged with 766 g of toluene and 400 g of a polyphenylene ether resin (PKN4752), and the mixture was stirred under heating at 90° C. to dissolve the resin. It was incorporated with 400 g of 2,2-bis(4-cyanatophenyl)propane and 9.2 g of p-(α-cumyl) phenol (manufactured by TOKYO KASEI KOGYO CO., LTD). The mixture was then incorporated with 0.1 g of zinc naphthenate as a reaction promoter, after it was confirmed to be homogeneous and kept at 110° C., and heated for 2 hours to synthesize the phenol-modified cyanate oligomer solution containing the polyphenylene ether resin, where the 2,2-bis (4-cyanatophenyl)propane was converted at a rate of 40%. The resultant synthetic solution was incorporated with 127 g of brominated triphenyl cyanurate (manufactured by Daiichi Kogyo Seiyaku Co., Ltd; Pyroguard SR-245) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 16 g of dimethoxydimethylsilane, 19 g of tetramethoxysilane and 52 g of methanol, to which 0.46 g of acetic acid and 8.8 g of distilled water were added, and the mixture was stirred at 50° C. for 8 hours to synthesize the silicone polymer with the siloxane unit having a polymerization degree of 28. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 688 g of methylethylketone and 1713 g of the same silica as used in EXAMPLE 9 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve or disperse the cyanate resin. The resultant solution was cooled to room temperature, and incorporated with 15.3 g of p-(α-cumyl)phenol, 0.05 g of zinc naphthenate as a setting promoter and 606 g of methylethylketone, to prepare the resin varnish containing non-volatile content at around 56%.

EXAMPLE 13

(Preparation of the Cyanate Resin Solution)

A 3-liter four-mouthed separable flask equipped with a thermometer, cooling tube and stirrer was charged with 775 g of toluene and 400 g of a polyphenylene ether resin (PKN4752), and the mixture was stirred under heating at 90° C. to dissolve the resin. It was incorporated with 400 g of bis(3,5-dimethyl-4-cyanatophenyl)methane and 25.6 g of p-tert-amyl phenol (manufactured by TOKYO KASEI KOGYO CO., LTD). The mixture was then incorporated with 0.1 g of manganese naphthenate as a reaction promoter, after it was confirmed to be homogeneous and kept at 110° C., and heated for 2 hours to synthesize the phenol-modified cyanate oligomer solution containing the polyphenylene ether resin, where the bis(3,5-dimethyl-4-cyanatophenyl) methane was converted at a rate of 38%. The resultant synthetic solution was incorporated with 122 g of bis (tribromophenoxy)ethane (manufactured by Great Lakes Chemical Corporation; FF-680) as a flame-retardant, to prepare the cyanate resin solution.

(Preparation of the Inorganic Filler Treated with the Silicone Polymer)

A 200-mL four-mouthed flask equipped with a thermometer, cooling tube and stirrer was charged with 10 g of trimethoxymethylsilane, 12 g of tetramethoxysilane and 33 g of methanol, to which 0.25 g of acetic acid and 5.6 g of distilled water were added, and the mixture was stirred at 50° C. for 8 hours to synthesize the silicone polymer with the siloxane unit having a polymerization degree of 22. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 641 g of methylethylketone and 1563 g of the same silica as used in EXAMPLE 9 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above, and the mixture was stirred at 65° C. for 1 hour to dissolve and disperse the cyanate resin. The resultant solution was cooled to room temperature, and incorporated with 0.05 g of zinc naphthenate as a setting promoter and 618 g of methylethylketone, to prepare the resin varnish containing non-volatile content at around 55%.

EXAMPLE 14

(Preparation of the Cyanate Resin Solution)

A 3-liter four-mouthed separable flask equipped with a thermometer, cooling tube and stirrer was charged with 454 g of toluene and 300 g of a polyphenylene ether resin (PKN4752), and the mixture was stirred under heating at 90° C. to dissolve the resin. It was incorporated with 250 g of 2,2-bis(4-cyanatophenyl)propane and 5.4 g of p-tert-butyl phenol. The mixture was then incorporated with 0.06 g of manganese naphthenate as a reaction promoter, after it was confirmed to be homogeneous and kept at 110° C., and heated for 2 hours to synthesize the phenol-modified cyanate oligomer solution containing the polyphenylene ether resin, where the 2,2-bis(4-cyanatophenyl)propane was converted at a rate of 41%. The resultant synthetic solution was used as the cyanate resin solution.

(Preparation of the Inorganic Filler Treated with the Silicon Polymer)

A 200-mL four-mouthed flask equipped with a thermometer, cooling tube and stirrer was charged with 10 g of dimethoxydimethylsilane, 10 g of trimethoxymethylsilane, 20 g of tetramethoxysilane and 59 g of methanol, to which 0.51 g of acetic acid and 10 g of distilled water were added, and the mixture was stirred at 50° C. for 8 hours to synthesize the silicone polymer with the siloxane unit having a polymerization degree of 23. The resultant silicone polymer had methoxy and/or silanol group as the terminal functional group reactive with hydroxyl group. The solution containing the silicone polymer, put in a 5-liter four-mouthed separable flask equipped with a thermometer, cooling tube and stirrer, was incorporated with 1234 g of methylethylketone and 2999 g of strontium titanate (average particle size: 1.0 μm) as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above and 288 g of brominated bisphenol A type epoxy resin (manufactured by Sumitomo Chemical Company, Ltd; ESB400T) as the epoxy resin, and the mixture was stirred at 65° C. for 1 hour to dissolve and disperse the cyanate resin. The resultant solution was cooled to room temperature, and incorporated with 13.7 g of p-(α-cumyl)phenol, 0.03 g of zinc naphthenate as a setting promoter and 531 g of methylethylketone, to prepare the resin varnish containing non-volatile content at around 63%.

EXAMPLE 15

(Preparation of the Cyanate Resin Solution)

A 3-liter four-mouthed separable flask equipped with a thermometer, cooling tube and stirrer was charged with 536 g of toluene and 345 g of a polyphenylene ether resin (PKN4752), and the mixture was stirred under heating at 90° C. to dissolve the resin. It was incorporated with 300 g of 2,2-bis(4-cyanatophenyl)-1,1,1,3,3,3-hexafluoropropane (manufactured by ASAHI CIBA CORPORATION; Arocy F-10) and 9.6 g of p-tert-octyl phenol. The mixture was then incorporated with 0.08 g of manganese naphthenate as a reaction promoter, after it was confirmed to be homogeneous and kept at 110° C., and heated for 2 hours to synthesize the phenol-modified cyanate oligomer solution containing the polyphenylene ether resin, where the 2,2-bis(4-cyanatophenyl)-1,1,1,3,3,3-hexafluoropropane was converted at a rate of 39%. The resultant synthetic solution was used as the cyanate resin solution.

(Preparation of the Inorganic Filler Treated with the Silicone Polymer)

A 5-liter four-mouthed flask equipped with a thermometer, cooling tube and stirrer was charged with 41.3 g of the solution prepared in the same manner as in EXAMPLE 1 to contain the silicone polymer, 7.5 g of γ-glycidoxypropyltrimethoxysilane (manufactured by Nippon Unicar Co., Ltd; A-187) as a silane-based coupling agent at a ratio of the silicone polymer to A-187 of 2:1 by weight, 689 g of methylethylketone, and 654 g of the same silica as used in EXAMPLE 9 as the inorganic filler. The mixture was then stirred at 80° C. for 1 hour to prepare the treatment solution containing the inorganic filler surface-treated with the silicone polymer.

(Preparation of the Resin Varnish)

The treatment solution containing the inorganic filler was incorporated with the cyanate resin solution prepared above and 200 g of an epoxy resin containing a dicyclopentadiene structure (manufactured by Dainippon Ink and Chemicals, Inc.; HP-7200) as the epoxy resin, and the mixture was stirred at 65° C. for 1 hour to dissolve and disperse the cyanate resin. The resultant solution was cooled to room temperature, and incorporated with 16.1 g of p-tert-octyl phenol, 0.04 g of zinc naphthenate as a setting promoter and 442 g of methylethylketone, to prepare the resin varnish containing non-volatile content at around 60%.

EXAMPLE 16

A 5-liter four-mouthed flask equipped with a thermometer, cooling tube and stirrer was charged with the cyanate resin solution prepared in the same manner as in EXAMPLE 9 and 1024 g of methylethylketone, and the mixture was stirred at 65° C. for 1 hour to dissolve the cyanate resin. The resultant solution was incorporated with the solution prepared in the same manner as in EXAMPLE 9 to contain the silicone polymer, and stirred for 30 minutes, to which 1275 g of the same silica as used in EXAMPLE 9 was added as the inorganic filler, and the mixture was stirred for 1 hour to disperse the inorganic filler. The resultant solution was cooled to room temperature, and incorporated with 0.05 g of zinc naphthenate as a setting promoter, to prepare the resin varnish containing non-volatile content at around 56%.

COMPARATIVE EXAMPLE 1

The cyanate resin solution prepared in the same manner as in EXAMPLE 1 was incorporated with 551 g of methylethylketone and 915 g of the same silica as used in EXAMPLE 1 as the inorganic filler, and the mixture was stirred at 65° C. for 1 hour and then cooled. The resultant solution was incorporated with 0.06 g of zinc naphthenate as a setting promoter, to prepare the resin varnish containing non-volatile content at around 65%.

COMPARATIVE EXAMPLE 2

A solution of 500 g of commercially available 2,2-bis(4-cyanatephenyl)propane oligomer (manufactured by ASAHI CIBA CORPORATION; Arocy B-10) dissolved in 214 g of toluene was prepared, and incorporated with 512 g of methylethylketone and 850 g of the same silica as used in EXAMPLE 1 as the inorganic filler. The mixture was stirred at 65° C. for 1 hour and then cooled. The resultant solution was incorporated with 0.18 g of zinc naphthenate as a setting promoter, to prepare the resin varnish containing non-volatile content at around 65%.

COMPARATIVE EXAMPLE 3

A cyanate resin solution was prepared by dissolving 500 g of commercially available 2,2-bis(4-cyanatephenyl)propane oligomer and 28.2 g of commercially available 2,2-bis(4-hydroxyphenyl)propane (manufactured by Mitsui Chemicals, Inc.; bisphenol A) in 226 g of toluene.

A treatment solution containing an inorganic filler surface-treated with a coupling agent was prepared in the same manner as in EXAMPLE 1, except that the silicone polymer-containing solution was replaced by 16 g of γ-glycidoxypropyltrimethoxysilane (manufactured by Nippon Unicar Co., Ltd; A-187) as a silane-based coupling agent.

Then, the treatment solution containing the inorganic filler was incorporated with the cyanate resin solution prepared above and 158 g of methylethylketone, and the mixture was stirred at 65° C. for 1 hour and then cooled. The resultant solution was incorporated with 0.18 g of zinc naphthenate as a setting promoter, to prepare the resin varnish containing non-volatile content at around 65%.

COMPARATIVE EXAMPLE 4

A cyanate resin solution was prepared in the same manner as in COMPARATIVE EXAMPLE 3, except that 2,2-bis(4-hydroxyphenyl)propane was replaced by 26.2 g of phenol novolac (manufactured by Hitachi Chemical Co., Ltd; HP850N).

A treatment solution containing an inorganic filler surface-treated with epoxy-modified silicone oil was prepared in the same manner as in COMPARATIVE EXAMPLE 3, except that the silane-based coupling agent was replaced by 16 g of epoxy-modified silicone oil (manufactured by Shinetsu Chemical Co., Ltd; KF-101).

Then, the treatment solution containing the inorganic filler was incorporated with the cyanate resin solution prepared above and 158 g of methylethylketone, and the mixture was stirred at 65° C. for 1 hour and then cooled. The resultant solution was incorporated with 0.18 g of zinc naphthenate as a setting promoter, to prepare the resin varnish containing non-volatile content at around 65%.

COMPARATIVE EXAMPLE 5

The cyanate resin solution prepared in the same manner as in EXAMPLE 9 was incorporated with 1044 g of methylethylketone and 1275 g of the same silica as used in EXAMPLE 9 as the inorganic filler, and the mixture was stirred at 65° C. for 1 hour and then cooled. The resultant solution, however, was significantly thickened at around room temperature, and then solidified into a grease-like solid. Therefore, it was incorporated further with 1258 g of toluene and stirred into a solution. It was incorporated with 0.05 g of zinc naphthenate as a setting promoter, to prepare the resin varnish containing non-volatile content at around 41%.

COMPARATIVE EXAMPLE 6

(Preparation of the Cyanate Resin Solution)

A cyanate resin solution was prepared in the same manner as in EXAMPLE 9, except that p-tert-butyl phenol was replaced by 22.6 g of 2,2-bis(4-hydroxyphenyl)propane (manufactured by Mitsui Chemicals, Inc.; bisphenol A). The solution was incorporated with 0.1 g of manganese naphthenate as a reaction promoter, after it was confirmed to be homogeneous and kept at 110° C., and heated for 1 hour to synthesize the phenol-modified cyanate oligomer solution, where the 2,2-bis(4-hydroxyphenyl)propane was converted at a rate of 41%.

(Preparation of the Inorganic Filler Treated with a Coupling Agent)

A treatment solution containing an inorganic filler treated with a coupling agent was prepared in the same manner as in EXAMPLE 1, except that the solution containing the silicone polymer was replaced by 22 g of γ-glycidoxypropyltrimethoxysilane as a silane-based coupling agent.

(Preparation of the Resin Varnish)

The treatment solution containing the inorganic filler was incorporated with the cyanate resin solution prepared above and 501 g of methylethylketone, and the mixture was stirred at 65° C. for 1 hour and then cooled. The resultant solution, however, was significantly thickened at around room temperature, and then solidified into a grease-like solid. Therefore, it was incorporated further with 1382 g of toluene and stirred into a solution. It was incorporated with 0.05 g of zinc naphthenate as a setting promoter, to prepare the resin varnish containing non-volatile content at around 40%.

COMPARATIVE EXAMPLE 7

(Preparation of the Cyanate Resin Solution)

A cyanate resin solution was prepared in the same manner as in COMPARATIVE EXAMPLE 6, except that 2,2-bis(4-hydroxyphenyl)propane was replaced by 21 g of phenol novolac (manufactured by Hitachi Chemical Co., Ltd; HP850N). The solution was incorporated with 0.1 g of manganese naphthenate as a reaction promoter, after it was confirmed to be homogeneous and kept at 110° C. and heated for 1 hour to synthesize the phenol-modified cyanate oligomer solution, where the 2,2-bis(4-cyanatophenyl)propane was converted at a rate of 41%.

(Preparation of the Inorganic Filler Treated with Epoxy-modified Silicone Oil)

A treatment solution containing an inorganic filler treated with epoxy-modified silicone oil was prepared in the same manner as in COMPARATIVE EXAMPLE 2, except that the silane-based coupling agent was replaced by 22 g of epoxy-modified silicone oil (manufactured by Shinetsu Chemical Co., Ltd; KF-101).

(Preparation of the Resin Varnish)

The treatment solution containing the inorganic filler was incorporated with the cyanate resin solution prepared above and 500 g of methylethylketone, and the mixture was stirred at 65° C. for 1 hour and then cooled. The resultant solution, however, was significantly thickened at around room temperature, and then solidified into a grease-like solid. Therefore, it was incorporated further with 1509 g of toluene and stirred into a solution. It was incorporated with 0.05 g of zinc naphthenate as a setting promoter, to prepare the resin varnish containing non-volatile content at around 39%.

COMPARATIVE EXAMPLE 8

(Preparation of the Cyanate Resin Solution)

A cyanate resin solution was prepared by dissolving 400 g of a commercially available 2,2-bis(4-cyanatephenyl)propane (manufactured by ASAHI CIBA CORPORATION; Arocy B-30) in 147 g of toluene, and incorporating the resultant solution with a solution of 320 g of a polyphenylene ether resin (PKN4752) dissolved in 442 g of toluene under heating at 90° C.

(Preparation of the Resin Varnish)

The cyanate resin solution was incorporated with 1002 g of methylethylketone and 1224 g of the same silica as used in EXAMPLE 9, and the mixture was stirred at 65° C. for 1 hour and then cooled. The resultant solution, however, was significantly thickened at around room temperature, and then solidified into a grease-like solid. Therefore, it was incorporated further with 987 g of toluene and stirred into a solution. It was incorporated with 0.15 g of zinc naphthenate as a setting promoter, to prepare the resin varnish containing non-volatile content at around 43%.

Next, a 0.2-mm thick glass cloth (E glass) was impregnated with the resin varnish prepared in each of EXAMPLES 1 to 16 and COMPARATIVE EXAMPLES 1 to 8, and dried at 160° C. for 5 to 10 minutes to produce the prepreg containing resin solid (resin+inorganic filler) at 65% by weight. Four sheets of the resultant prepreg were placed one on another. The resultant laminate was coated with a 18-μm thick copper foil on each of the outermost layers, pressed under heating at 170° C. and 3.0 MPa for 60 minutes, and thermally treated at 230° C. for 120 minutes, to prepare the double-sided copper clad laminate. It was evaluated for its dielectric properties, solder heat resistance, drill-machinability and resistance to electric corrosion. The results are given in Tables 1 and 2.

The double-sided copper clad laminate was evaluated by the following procedures. Varnish spreadability and prepreg appearances were evaluated beforehand by visual observation. For spreadability, a varnish was marked ○, when no inorganic filler was attached to the roll while it was spread, and others with X even when it was attached only slightly. For appearance, a prepreg was marked with ○ when it had surface smoothness on a level with that of the common prepreg containing no filler, and others with X.

Relative dielectric constant ($\epsilon r$) and dielectric loss tangent (tan δ) at 1 MHz were measured in accordance with JIS C-6481, and those at 1 GHz by the triplate-structured straight-line resonator method using a network analyzer.

For solder heat resistance, the copper clad laminate with etched copper foil was held in a pressure cooker tester under conditions of 121° C. and 203 kPa for 2 hours, and then immersed in molten solder kept at 260° C. for 20 seconds to visually observe its outer appearances. "Pass" described in the tables means no measling or blister was observed.

Water absorptivity (unit: % by weight) was determined from the weight difference between the laminate kept under the normal conditions and that kept under the conditions of 121° C. and 203 kPa for 2 hours in the pressure cooker.

For drill-machinability, the double-sided copper clad laminate was bored by a drill (diameter: 0.4 mm) at 80,000 rpm and feed rate of 2,400 mm/minute, and each of the resultant through-hole was plated by the normal procedure. It was used as the base for a cast sample of epoxy resin, and the through-hole was microscopically observed, to evaluate magnitude of cracking (average of the 20 holes, unit: μm), caused by delamination or the like, on the hole walls at the interface between the glass cloth and resin material.

For resistance to electric corrosion, the double-sided copper clad laminate was bored by a drill (diameter: 0.4 mm) at 80,000 rpm and feed rate of 2,400 mm/minute to provide the through-holes at a pitch of 350 μm. Each through-hole was plated by the normal procedure to prepare a wiring board with a test pattern. A voltage of 100V was applied to the test piece thus prepared kept under conditions of 85° C. and 85% RH, to measure time before current-caused breakdown was observed.

TABLE 1

| Items | EXAMPLES | | | | | | | | COMPARATIVE EXAMPLES | | | |
|---|---|---|---|---|---|---|---|---|---|---|---|---|
| | 1 | 2 | 3 | 4 | 5 | 6 | 7 | 8 | 1 | 2 | 3 | 4 |
| Spreadability | ○ | ○ | ○ | ○ | ○ | ○ | ○ | ○ | x | x | x | x |
| Prepreg appearance | ○ | ○ | ○ | ○ | ○ | ○ | ○ | ○ | x | x | x | x |
| ε γ   1 MHz | 3.75 | 3.63 | 3.56 | 3.72 | 3.70 | 10.50 | 3.63 | 3.75 | 3.78 | 3.85 | 3.86 | 3.88 |
| 1 GHz | 3.72 | 3.60 | 3.53 | 3.68 | 3.66 | 9.90 | 3.61 | 3.72 | 3.75 | 3.83 | 3.83 | 3.86 |
| tan δ   1 MHz | 0.0029 | 0.0027 | 0.0025 | 0.0028 | 0.0028 | 0.0029 | 0.0030 | 0.0029 | 0.0031 | 0.0035 | 0.0036 | 0.0037 |
| 1 GHz | 0.0035 | 0.0034 | 0.0029 | 0.0033 | 0.0034 | 0.0035 | 0.0036 | 0.0035 | 0.0036 | 0.0043 | 0.0043 | 0.0045 |
| Solder heat resistance | Pass | Pass | Pass | Pass | Pass | Pass | Pass | Pass | Blister | Blister | Blister | Blister |
| Water absorptivity (% by weight) | 0.32 | 0.31 | 0.33 | 0.31 | 0.30 | 0.30 | 0.29 | 0.33 | 0.56 | 0.62 | 0.59 | 0.63 |
| Drill-machinability (magnitude of cracking, μm) | 25 | 26 | 21 | 25 | 28 | 23 | 25 | 26 | 43 | 45 | 38 | 37 |
| Resistance to electric corrosion (hours) | >500 | >500 | >500 | >500 | >500 | >500 | >500 | >500 | 24 | 12 | 24 | 48 |

TABLE 2

| Items | EXAMPLES | | | | | | | | COMPARATIVE EXAMPLES | | | |
|---|---|---|---|---|---|---|---|---|---|---|---|---|
| | 9 | 10 | 11 | 12 | 13 | 14 | 15 | 16 | 5 | 6 | 7 | 8 |
| Spreadability | ○ | ○ | ○ | ○ | ○ | ○ | ○ | ○ | x | x | x | x |
| Prepreg appearance | ○ | ○ | ○ | ○ | ○ | ○ | ○ | ○ | x | x | x | x |
| ε γ   1 MHz | 3.67 | 3.56 | 3.51 | 3.65 | 3.62 | 10.20 | 3.52 | 3.67 | 3.70 | 3.74 | 3.74 | 3.81 |
| 1 GHz | 3.63 | 3.53 | 3.48 | 3.62 | 3.61 | 9.70 | 3.50 | 3.64 | 3.66 | 3.70 | 3.72 | 3.78 |
| tan δ   1 MHz | 0.0022 | 0.0020 | 0.0019 | 0.0022 | 0.0022 | 0.0024 | 0.0020 | 0.0022 | 0.0023 | 0.0029 | 0.0031 | 0.0039 |
| 1 GHz | 0.0029 | 0.0027 | 0.0026 | 0.0028 | 0.0030 | 0.0035 | 0.0033 | 0.0029 | 0.0031 | 0.0037 | 0.0040 | 0.0045 |

TABLE 2-continued

|  | EXAMPLES | | | | | | | | COMPARATIVE EXAMPLES | | | |
| --- | --- | --- | --- | --- | --- | --- | --- | --- | --- | --- | --- | --- |
| Items | 9 | 10 | 11 | 12 | 13 | 14 | 15 | 16 | 5 | 6 | 7 | 8 |
| Solder heat resistance | Pass | Pass | Pass | Pass | Pass | Pass | Pass | Pass | Blister | Blister | Blister | Blister |
| Water absorptivity (% by weight) | 0.29 | 0.27 | 0.26 | 0.29 | 0.31 | 0.32 | 0.25 | 0.30 | 0.53 | 0.51 | 0.48 | 0.55 |
| Drill-machinability (magnitude of cracking, μm) | 23 | 24 | 22 | 21 | 19 | 26 | 24 | 23 | 36 | 42 | 38 | 41 |
| Resistance to electric corrosion (hours) | >500 | >500 | >500 | >500 | >500 | >500 | >500 | >500 | 12 | 24 | 48 | 12 |

It is apparent, as shown in Tables 1 and 2, that the varnish prepared in each of EXAMPLES 1 to 16 provided a prepreg which had good appearances with a smooth surface. By contrast, in the varnish prepared in each of COMPARATIVE EXAMPLES 1 to 8, the agglomerated inorganic filler particles were precipitated, and the varnish provided a defective prepreg with lines on the surface, dripped and foamed resin, and agglomerated inorganic filler particles. Moreover, the varnish prepared in each of EXAMPLES 1 to 16 exhibited good workability, no inorganic filler attached to the roll while the varnish was spread.

Further, the varnish prepared in each of EXAMPLES 1 to 16 provided a laminate excellent in dielectric properties, and in particular, low in relative dielectric constant and dielectric loss tangent at a high-frequency bandwidth (1 GHz), where it should be noted that the varnish prepared in each of EXAMPLES 6 and 14 was intended to have a high dielectric constant and low dielectric loss tangent. In addition, each of the above laminates had a lower water absorptivity, higher heat resistance while it was absorbing moisture, better drill-machinability because of lower magnitude of cracking on the hole walls and higher resistance to electric corrosion than the one which used the varnish prepared in each of COMPARATIVE EXAMPLES.

EXAMPLE 17

A 2-liter four-mouthed separable flask equipped with a thermometer, cooling tube and stirrer was charged with 231 g of toluene, 2,2-bis(4-cyanatephenyl)propane and p-(α-cumyl)phenol. The mixture was then incorporated with zinc naphthenate as a reaction promoter, after it was kept at 120° C. as liquid temperature, and heated for 4 hours (reactant concentration: 75% by weight) to synthesize the phenol-modified cyanate oligomer, where the reaction process was controlled to have a cyanate compound monomer conversion of about 55%. This conversion was confirmed by liquid chromatography (Chromatograph: pump; manufactured by Hitachi, Ltd; L-6200, RI detector; L-3300, and columns, Manufactured by TOSHO CORPORATION, TSKgel-G4000H and G2000H, solvent: THF, concentration: 1%). The same chromatograph was used to determine number-average molecular weight of the product with a calibration curve of the standard polystyrene. The phenol-modified cyanate ester oligomer had a number-average molecular weight (Mn) of 1,430 on the cyanate monomer-free basis. It was also confirmed by the same chromatograph that the elution peak of p-(α-cumyl) phenol disappeared.

The phenol-modified cyanate oligomer was cooled to room temperature, and incorporated with methylethylketone and the same zinc naphthenate. The mixture was stirred for 1 hour, to prepare the varnish containing non-volatile content at 65% and a gelation time (at 160° C.) of around 300 seconds.

EXAMPLE 18

A varnish was prepared in the same manner as in EXAMPLE 17, except that p-(α-cumyl) phenol was incorporated at a rate shown in Table 3 in two installments, during the process of synthesizing the mixed oligomer and after it was cooled.

EXAMPLE 19

A varnish was prepared in the same manner as in EXAMPLE 17, except that brominated bisphenol A type epoxy resin (manufactured by Sumitomo Chemical Company, Ltd; ESB400T) was incorporated at a rate shown in Table 3 in the synthesized mixed oligomer, after it was cooled.

EXAMPLE 20

A varnish was prepared in the same manner as in EXAMPLE 17, except that 2,2-bis(4-cyanatephenyl)propane was replaced by bis(3,5-dimethyl-4-cyanatophenyl)methane, which was incorporated at a rate shown in Table 3.

EXAMPLE 21

A varnish was prepared in the same manner as in EXAMPLE 17, except that p-(α-cumyl)phenol was replaced by p-tert-octyl phenol, which was incorporated at a rate shown in Table 3.

EXAMPLE 22

A varnish was prepared in the same manner as in EXAMPLE 19, except that brominated bisphenol A type epoxy resin was replaced by a phenol salicylaldehyde novolac type epoxy resin substituted by methyl and tert-butyl groups (manufactured by Sumitomo Chemical Company, Ltd; ESB400T), which was incorporated at a rate shown in Table 3.

COMPARATIVE EXAMPLE 9

A varnish was prepared in the same manner as in EXAMPLE 17, except that the synthesized mixed oligomer was replaced by an oligomer composed of 2,2-bis(4-cyanatephenyl)propane alone (manufactured by ASAHI CIBA CORPORATION; Arocy B-30) dissolved at room temperature in toluene at a rate shown in Table 4.

COMPARATIVE EXAMPLE 10

A varnish was prepared in the same manner as in EXAMPLE 17, except that p-(α-cumyl)phenol was replaced by 2,2-bis(4-hydroxyphenyl)propane (bisphenol A), which was incorporated at a rate shown in Table 4.

COMPARATIVE EXAMPLE 11

A varnish was prepared by incorporating the varnish prepared in COMPARATIVE EXAMPLE 9 with phenol novolac (manufactured by Hitachi Chemical Co., Ltd; HP850) at room temperature at a rate shown in Table 4.

COMPARATIVE EXAMPLE 12

A varnish was prepared by incorporating the varnish prepared in COMPARATIVE EXAMPLE 9 with brominated bisphenol A type epoxy resin at room temperature at a rate shown in Table 4.

COMPARATIVE EXAMPLE 13

A varnish was prepared in the same manner as in COMPARATIVE EXAMPLE 12, except that brominated bisphenol A type epoxy resin was replaced by a phenol salicylaldehyde novolac type epoxy resin substituted by tert-butyl group, which was incorporated at a rate shown in Table 4.

COMPARATIVE EXAMPLE 14

A varnish was prepared by incorporating the varnish prepared in COMPARATIVE EXAMPLE 9 with p-(α-cumyl)phenol at room temperature at a rate shown in Table 4.

COMPARATIVE EXAMPLE 15

A varnish, containing non-volatile content at 55% by weight, was prepared in the same manner as in EXAMPLE 17, except that 2,2-bis(4-cyanatophenyl)propane and p-(α-cumyl)phenol were incorporated in a solution of poly(2,6-dimethyl-1,4-phenylene ether) [number-average molecular weight: around 17,000 and weight-average molecular weight: around 49,000, both determined by gel permeation chromatography with a calibration curve of the standard polystyrene] dissolved in toluene, to synthesize the phenol-modified cyanate oligomer in the presence of a polyphenylene ether, and methylethylketone was incorporated in the resultant ether.

TABLE 3

Compositions
Unit: parts by weight

| | Items | EXAMPLES | | | | | |
| | | 17 | 18 | 19 | 20 | 21 | 22 |
|---|---|---|---|---|---|---|---|
| Cyanate compounds | 2,2-Bis(4-cyanatophenyl)propane | 300 | 300 | 300 | — | 300 | 300 |
| | Bis(3,5-dimethyl-4-cyanatophenyl)methane | — | — | — | 300 | — | — |
| Phenol compounds | P-(α-cumyl)phenol (during the synthesis process) | 36 | 6 | 36 | 35 | — | 36 |
| | P-(α-cumyl)phenol (after the synthesis product was cooled) | — | 30 | — | — | — | — |
| | P-tert-octyl phenol | — | — | — | — | 35 | — |
| Zinc naphthenate (during the oligomer synthesis process) | | 0.2 | 0.5 | 0.2 | 0.2 | 0.2 | 0.2 |
| Zinc naphthenate (after the synthesis product was cooled) | | 0.4 | 0.1 | 0.4 | 0.4 | 0.4 | 0.4 |
| Conversion (%) | | 55 | 56 | 56 | 54 | 56 | 54 |
| Epoxy resins | ESB-400T | — | — | 120 | — | — | — |
| | TMH574 | — | — | — | — | — | 75 |

TABLE 4

Compositions
Unit: parts by weight

| | Items | COMPARATIVE EXAMPLES (parts by weight) | | | | | | |
| | | 9 | 10 | 11 | 12 | 13 | 14 | 15 |
|---|---|---|---|---|---|---|---|---|
| Cyanate compounds | 2,2-Bis(4-cyanatophenyl)propane | — | 300 | — | — | — | — | 300 |
| | Acocy B-30 | 300 | — | 300 | 300 | 300 | 300 | — |
| Phenol compounds | P-(α-cumyl)phenol | — | — | — | — | — | 36 | 36 |
| | Bisphenol A | — | 17 | — | — | — | — | — |
| | HP850 | — | — | 15 | — | — | — | — |
| Polyphenylene ether | | — | — | — | — | — | — | 50 |
| Zinc naphthenate (during the oligomer synthesis process) | | — | 0.1 | — | — | — | — | 0.2 |
| Zinc naphthenate (after the synthesis product was cooled) | | 1.0 | 0.5 | 0.6 | 1.0 | 1.0 | 0.7 | 0.4 |
| Conversion (%) | | — | 55 | — | — | — | — | 55 |
| Epoxy resins | ESB-400T | — | — | — | 120 | — | — | — |
| | TMH574 | — | — | — | — | 75 | — | — |

Viscosity of the varnish prepared in each of EXAMPLES 17 to 22 and COMPARATIVE EXAMPLES 9 to 15 was measured at 25° C. by an E type viscometer, immediately after it was prepared and after it was left at 20° C. for 7 days.

A 0.2-mm thick woven fabric of glass (E glass) was impregnated with the varnish immediately after it was prepared, and dried to produce the prepreg which contained the resin at around 41.0% by weight. The appearances of prepregs were visually observed. The results are given in Tables 5 and 6, where "good" means that the prepreg had smooth surface showing no lines, or dripped or foamed resin.

Four sheets of the resultant prepreg were placed one on to another. The resultant laminate was coated with a 18-μm thick copper foil on the outermost layer, pressed under heating at 170° C. and 3.0 MPa for 60 minutes, and thermally treated at 230° C. for 120 minutes, to prepare the copper-clad laminate having a thickness of around 0.8 mm. It was evaluated for its dielectric properties, solder heat resistance and punching-machinability. The results are given in Tables 5 and 6.

The copper-clad laminate was evaluated by the following procedures.

Relative dielectric constant (εr) and dielectric loss tangent (tan δ) at 1 MHz and 1 GHz were measured in the same manner as in EXAMPLE 1.

Solder heat resistance: Measured in the same manner as in EXAMPLE 1, except that the pressure cooker test (PCT) was conducted at 0.22 MPa.

Prepreg appearance: The laminate with etched copper foil was treated by a blank and pierce die, and observed for appearances of the cut-off section. "Good" in Tables 5 and 6 means that there was no delamination, fuzz, burr or the like.

Copper foil peel strength: Measured in accordance with JIS C-6481.

The results are given in Tables 5 and 6.

TABLE 5

Test Results

| | | | COMPARATIVE EXAMPLES | | | | | |
|---|---|---|---|---|---|---|---|---|
| Items | | | 17 | 18 | 19 | 20 | 21 | 22 |
| Varnish viscosity (cP, 25? C) | Immediately after the test piece was prepared | | 87 | 71 | 91 | 102 | 84 | 80 |
| | 1 day after the test piece was prepared | | 88 | 71 | 90 | 104 | 86 | 78 |
| | 7 days after the test piece was prepared | | 102 | 92 | 105 | 121 | 105 | 112 |
| Prepreg appearance | | | Good | Good | Good | Good | Good | Good |
| ε γ | 1 MHz | | 3.67 | 3.66 | 3.74 | 3.61 | 3.67 | 3.76 |
| | 1 GHz | | 3.62 | 3.61 | 3.69 | 3.58 | 3.62 | 3.75 |
| tan δ | 1 MHz | | 0.0025 | 0.0024 | 0.0039 | 0.0022 | 0.0027 | 0.0042 |
| | 1 GHz | | 0.0055 | 0.0053 | 0.0063 | 0.0048 | 0.0056 | 0.0065 |
| Solder heat resistance (No. of test pieces showing no abnormality/ No. of test pieces tested) | | PCT 1 h | 3/3 | 3/3 | 3/3 | 3/3 | 3/3 | 3/3 |
| | | PCT 2 h | 3/3 | 3/3 | 3/3 | 3/3 | 3/3 | 3/3 |
| | | PCT 3 h | 3/3 | 3/3 | 3/3 | 3/3 | 3/3 | 3/3 |
| | | PCT 4 h | 3/3 | 3/3 | 3/3 | 3/3 | 3/3 | 3/3 |
| | | PCT 5 h | 3/3 | 3/3 | 3/3 | 3/3 | 3/3 | 3/3 |
| Copper clad peel strength (kN/m) | | | 1.60 | 1.60 | 1.56 | 1.57 | 1.60 | 1.58 |
| Machinability | | | Good | Good | Good | Good | Good | Good |

TABLE 6

Test Results

| | | | COMPARATIVE EXAMPLES | | | | | | |
|---|---|---|---|---|---|---|---|---|---|
| Items | | | 9 | 10 | 11 | 12 | 13 | 14 | 15 |
| Varnish viscosity (cP, 25° C.) | Immediately after the test piece was prepared | | 83 | 345 | 675 | 78 | 83 | 76 | 80 |
| | 1 day after the test piece was prepared | | 84 | Gelled | Gelled | 89 | 90 | 81 | 84 |
| | 7 days after the test piece was prepared | | 105 | — | — | 118 | 120 | 98 | 95 |
| Prepreg appearance | | | Good | Good | Foaming | Good | Good | Good | Foaming/lines |
| ε γ | 1 MHz | | 3.79 | 3.86 | 3.95 | 3.84 | 3.86 | 3.68 | 3.63 |
| | 1 GHz | | 3.76 | 3.83 | 3.91 | 3.77 | 3.80 | 3.67 | 3.57 |
| tan δ | 1 MHz | | 0.0065 | 0.0066 | 0.0072 | 0.0067 | 0.0064 | 0.0029 | 0.0025 |
| | 1 GHz | | 0.0095 | 0.0098 | 0.0115 | 0.0123 | 0.0115 | 0.0058 | 0.0050 |
| Solder heat resistance (No. of test pieces showing no abnormality /No. of test pieces tested) | | PCT 1 h | 3/3 | 0/3 | 0/3 | 3/3 | 3/3 | 3/3 | 3/3 |
| | | PCT 2 h | 2/3 | 0/3 | 0/3 | 3/3 | 3/3 | 3/3 | 3/3 |
| | | PCT 3 h | 1/3 | 0/3 | 0/3 | 1/3 | 1/3 | 3/3 | 3/3 |
| | | PCT 4 h | 0/3 | 0/3 | 0/3 | 0/3 | 0/3 | 2/3 | 3/3 |
| | | PCT 5 h | 0/3 | 0/3 | 0/3 | 0/3 | 0/3 | 0/3 | 1/3 |
| Copper clad peel strength (kN/m) | | | 1.60 | 1.10 | 1.07 | 1.54 | 1.57 | 1.57 | 1.60 |
| Machinability | | | Good | Fuzz/burr | Fuzz/burr | Good | Good | Good | Good |

As shown in Table 5, the varnish prepared in each of EXAMPLES 17 to 22 exhibited good storage stability. Each of these varnishes provide a copper-clad laminate good in heat resistance while it was absorbing moisture and machinability. Moreover, each of these copper-clad laminates had slightly higher heat resistance while it was absorbing moisture than the one which used the varnish prepared in COMPARATIVE EXAMPLE 6. Further, each of the prepregs which used the varnish prepared in each of EXAMPLES 17 to 22 had smother surface and hence had better appearances than the one which used the varnish prepared in COMPARATIVE EXAMPLE 15.

By contrast, the varnish prepared in each of COMPARATIVE EXAMPLES 10 and 11, incorporated with a polyvalent phenol, was highly viscous immediately after it was prepared, and had a very short pot life as to be gelled when stored for only 1 day. Moreover, the varnish prepared in each of COMPARATIVE EXAMPLES 9 to 13 gave the copper-clad laminate higher both in relative dielectric constant and dielectric loss tangent than the one which used the varnish prepared in each EXAMPLE, more notably higher in dielectric loss tangent at 1 GHz. Still more, the varnish prepared in each of COMPARATIVE EXAMPLES 10 and 11 gave the copper-clad laminate lower both in heat resistance while it was absorbing moisture and peel strength of the copper foil than the one which used the varnish prepared in each EXAMPLE.

POSSIBILITY OF INDUSTRIAL UTILIZATION

According to the present invention, the varnish has excellent dielectric properties, provides a laminate as formable and machinable as the conventional laminate of a thermosetting resin, e.g., epoxy resin, and provides a laminate and printed-wiring board high in heat resistance and excellent in dielectric properties.

The invention claimed is:

1. A varnish comprising a resin composition including, as essential components, a cyanate compound (A) having 2 or more cyanato groups in the molecule; a phenol compound (B); a polyphenylene ether resin (C); and an inorganic filler (F) surface-treated with a silicone polymer (D) having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less and at least one terminal functional group reactive with hydroxyl group, dissolved or dispersed in a solvent, wherein said solvent is a mixture of aromatic hydrocarbon and ketone.

2. A process for producing a prepreg, comprising:

impregnating a base material for said prepreg with said varnish according to claim 1, so as to form an impregnated base material, and drying said impregnated base material.

3. The process for producing a prepreg according to claim 2, wherein said base material is a glass cloth.

4. A method of fabricating an article of manufacture, comprising laminating a plurality of prepregs, at least one formed by the process of claim 2, to each other, thereby forming a laminate of prepregs.

5. The method of fabricating an article of manufacture according to claim 4, further comprising providing a metal layer on the laminate of prepregs, thereby forming a metal-clad laminate.

6. The method of fabricating an article of manufacture according to claim 5, wherein the metal layer is a wiring layer, and the article of manufacture is a printed wiring board.

7. A varnish comprising a resin composition including, as essential components, a phenol-modified cyanate ester oligomer produced by reacting a cyanate compound (A) having 2 or more cyanato groups in the molecule with a phenol compound (B) at an equivalent ratio of the phenolic hydroxylic group in the phenol compound (B) to the cyanato group in the cyanate compound (A) (hydroxylic group/cyanato group ratio) in a range from 0.01 to 0.30; phenol compound (B) incorporated at a hydroxylic group/cyanato group equivalent ratio in a range below 0.29 (this equivalent ratio is in a range from 0.025 to 0.30, with this phenol compound (B) combined with the phenol compound (B) used for production of the phenol-modified cyanate ester oligomer); polyphenylene ether resin (C); and inorganic filler (F) surface-treated with a silicone polymer (D) having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least terminal functional group reactive with hydroxyl group, dissolved or dispersed in a solvent, wherein said solvent is a mixture of aromatic hydrocarbon and ketone.

8. A process for producing a prepreg, comprising:

impregnating a base material for said prepreg with said varnish according to claim 7, so as to form an impregnated base material, and drying said impregnated base material.

9. A method of fabricating an article of manufacture comprising laminating a plurality of prepregs, at least one formed by the process of claim 8, to each other, thereby forming a laminate of prepregs.

10. The method of fabricating an article of manufacture according to claim 9, further comprising providing a metal layer on the laminate of prepregs, thereby forming a metal-clad laminate.

11. The method of fabricating an article of manufacture according to claim 10, wherein the metal layer is a wiring layer, and the article of manufacture is a printed wiring board.

12. A varnish comprising a resin composition including, as essential components, a phenol-modified cyanate ester oligomer containing a polyphenylene ether resin, produced by reacting a cyanate compound (A) with a phenol compound (B) in the presence of a polyphenylene ether resin (C) at an equivalent ratio of the phenolic hydroxylic group in the phenol compound (B) to the cyanato group in the cyanate compound (A) (hydroxylic group/cyanato group ratio) in a range from 0.01 to 0.30; phenol compound (B) incorporated at an equivalent ratio of the phenolic hydroxylic group in the phenol compound (B) to the cyanato group in the cyanate compound (A) (hydroxylic group/cyanato group ratio) in a range below 0.29 (this equivalent ratio is in a range from 0.025 to 0.30, with this phenol compound (B) combined with the phenol compound (B) used for production of the phenol-modified cyanate ester oligomer); and inorganic filler (F) surface-treated with a silicone polymer (D) having at least one siloxane unit selected from the group consisting of a tri-functional siloxane unit represented by the formula $RSiO_{3/2}$ (wherein, R is an organic group, and when 2 or more Rs are present in the silicone polymer, they may be the same or different) and tetra-functional siloxane unit represented by $SiO_{4/2}$, polymerization degree of 7,000 or less, and at least one terminal functional group reactive with hydroxyl group, dissolved or dispersed in a solvent, wherein said solvent is a mixture of aromatic hydrocarbon and ketone.

13. A process for producing a prepreg, comprising:
impregnating a base material for said prepreg with said varnish according to claim 12, so as to form an impregnated base material, and drying said impregnated base material.

14. A method of fabricating an article of manufacture comprising laminating a plurality of prepregs, at least one formed by the process of claim 13, to each other, thereby forming a laminate of prepregs.

15. The method of fabricating an article of manufacture according to claim 14, further comprising providing a metal layer on the laminate of prepregs, thereby forming a metal-clad laminate.

16. The method of fabricating an article of manufacture according to claim 15, wherein the metal layer is a wiring layer, and the article of manufacture is a printed wiring board.

* * * * *